US011812647B2

(12) United States Patent
Koo et al.

(10) Patent No.: US 11,812,647 B2
(45) Date of Patent: Nov. 7, 2023

(54) DISPLAY APPARATUS AND METHOD OF MANUFACTURING THE SAME

(71) Applicant: Samsung Display Co., Ltd., Yongin-Si (KR)

(72) Inventors: Soyoung Koo, Yongin-si (KR); Eoksu Kim, Yongin-si (KR); Hyungjun Kim, Yongin-si (KR); Yunyong Nam, Yongin-si (KR); Junhyung Lim, Yongin-si (KR); Kyungjin Jeon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/841,206

(22) Filed: Jun. 15, 2022

(65) Prior Publication Data

US 2023/0037108 A1    Feb. 2, 2023

(30) Foreign Application Priority Data

Jul. 27, 2021    (KR) .................... 10-2021-0098532

(51) Int. Cl.
| | |
|---|---|
| *H10K 59/131* | (2023.01) |
| *G09G 3/3266* | (2016.01) |
| *G09G 3/3291* | (2016.01) |
| *H10K 59/122* | (2023.01) |
| *H10K 59/12* | (2023.01) |

(52) U.S. Cl.
CPC ......... *H10K 59/131* (2023.02); *G09G 3/3266* (2013.01); *G09G 3/3291* (2013.01); *H10K 59/122* (2023.02); *G09G 2300/0426* (2013.01); *H10K 59/1201* (2023.02)

(58) Field of Classification Search
CPC .. G09G 3/3266; G09G 3/3291; H10K 59/131; H10K 59/122; H10K 59/126; H10K 59/121; H10K 59/1213; H10K 59/124
See application file for complete search history.

(56) References Cited

U.S. PATENT DOCUMENTS

| | | | |
|---|---|---|---|
| 6,917,394 | B2 | 7/2005 | Song et al. |
| 9,443,886 | B2 | 9/2016 | Oh et al. |
| 9,478,771 | B2 | 10/2016 | Song et al. |
| 11,227,843 | B2 * | 1/2022 | Park ................. H10K 50/844 |

(Continued)

FOREIGN PATENT DOCUMENTS

| | | |
|---|---|---|
| KR | 10-0756251 B1 | 9/2007 |
| KR | 10-2016-0029487 A | 3/2016 |

(Continued)

*Primary Examiner* — Sardis F Azongha
(74) *Attorney, Agent, or Firm* — Innovation Counsel LLP

(57) ABSTRACT

A display apparatus is disclosed that includes contact holes formed to expose at least a portion of a conductive layer or a semiconductor layer without damage to the surface of the conductive layer or the semiconductor layer, and a method of manufacturing the display apparatus. The display apparatus includes a substrate, a conductive mound arranged on the substrate, a first insulating mound arranged on the substrate, and a semiconductor layer including a first region arranged on the conductive mound, and a second region arranged on the first insulating mound. The second region of the semiconductor layer substantially covers an upper surface of the first insulating mound.

21 Claims, 17 Drawing Sheets

(56) References Cited

U.S. PATENT DOCUMENTS

| | | | |
|---|---|---|---|
| 11,335,273 B2* | 5/2022 | Choi | ............... H10K 59/1201 |
| 11,521,552 B2* | 12/2022 | Park | ................. G09G 3/3266 |
| 2020/0321427 A1 | 10/2020 | Park et al. | |
| 2020/0365077 A1 | 11/2020 | Park et al. | |

FOREIGN PATENT DOCUMENTS

| KR | 10-2028025 B1 | 10/2019 |
|---|---|---|
| KR | 10-2020-0131401 B1 | 11/2020 |
| KR | 10-2021-0002170 A | 1/2021 |

\* cited by examiner

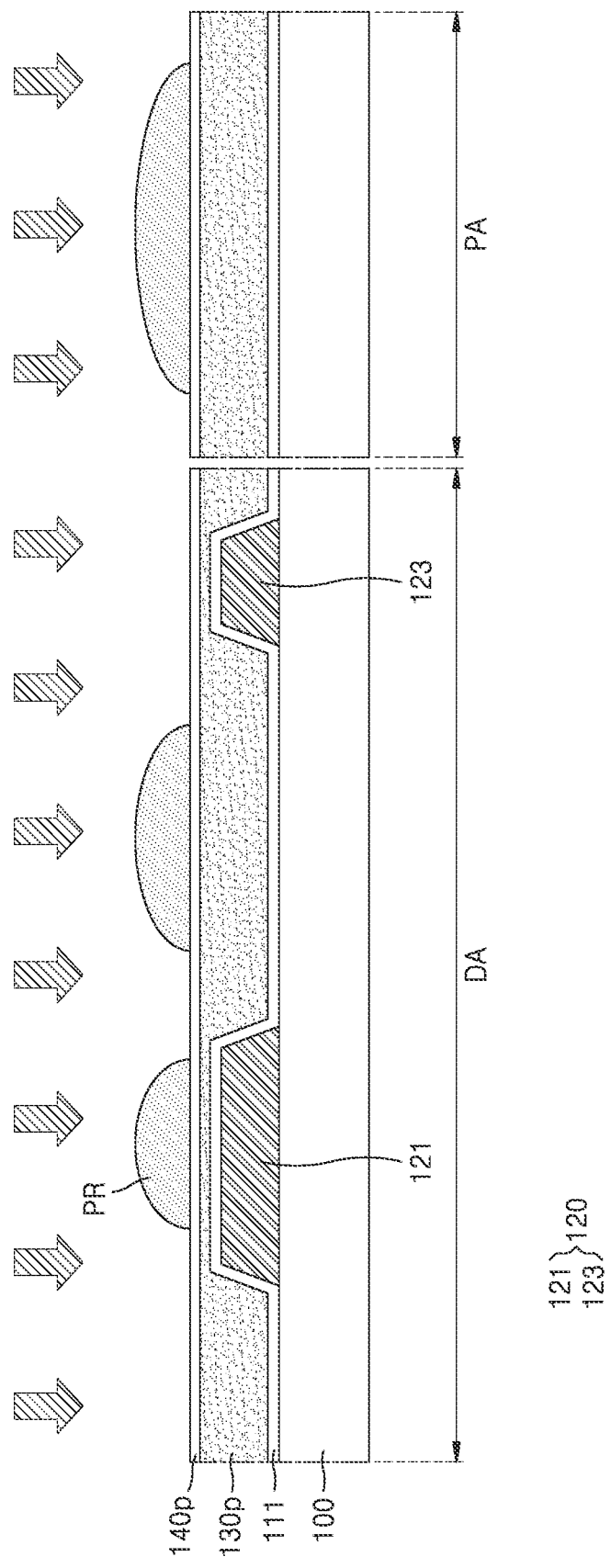

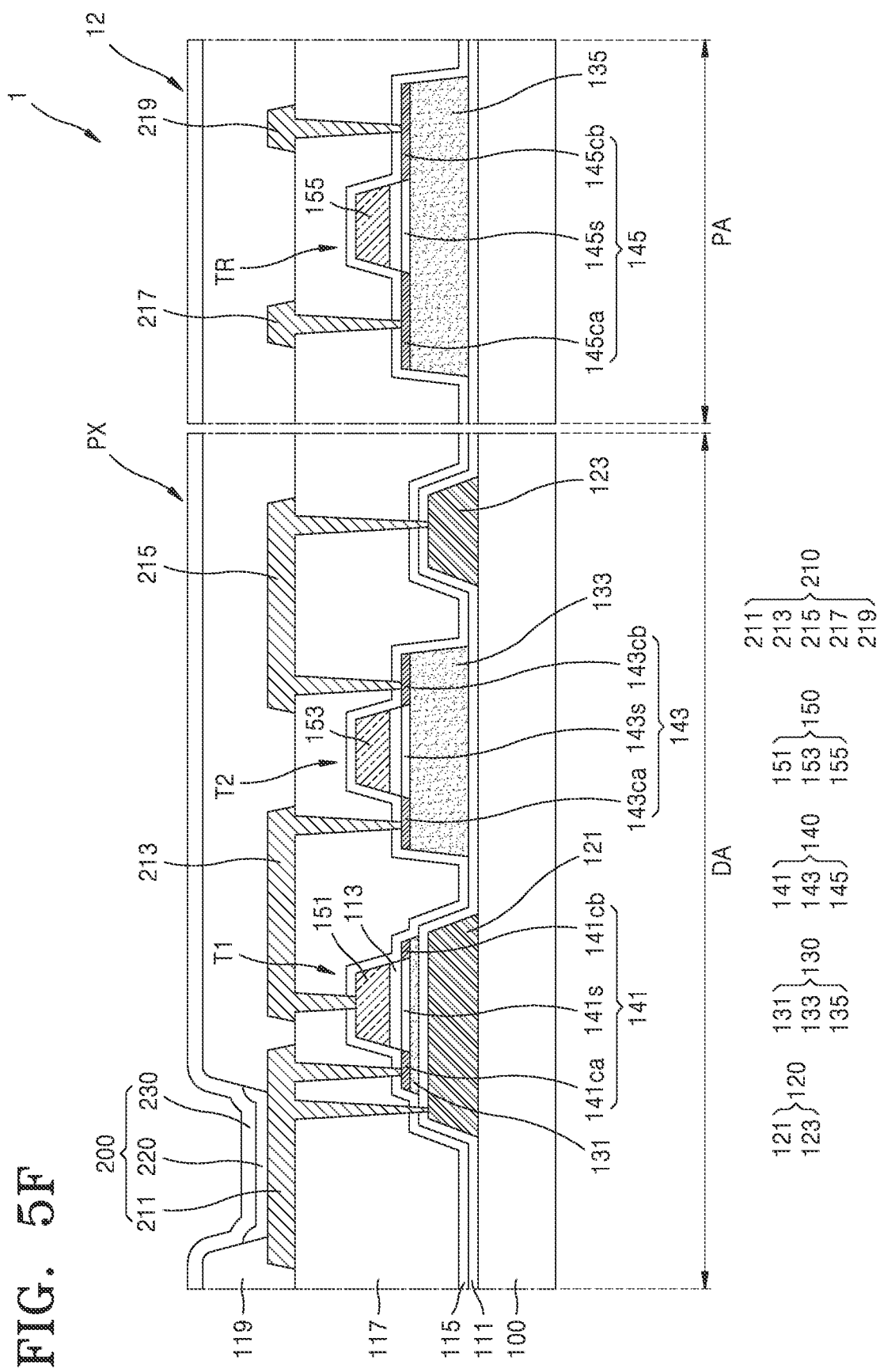

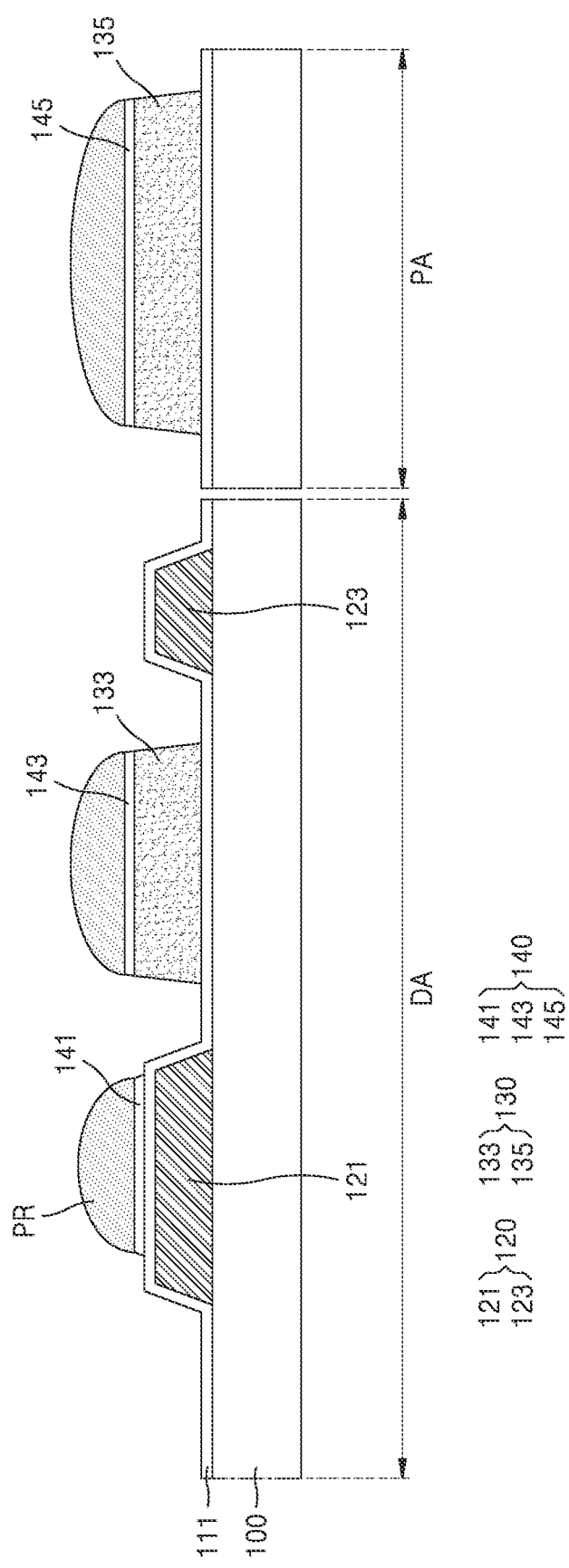

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0098532, filed on Jul. 27, 2021, in the Korean Intellectual Property Office, the disclosure of which is incorporated herein in its entirety by reference.

BACKGROUND

1. Field

The present inventive concept relates to a display apparatus and a method of manufacturing the same.

2. Description of the Related Art

Display apparatuses visually display data. Display apparatuses are used as displays of small products, such as mobile phones, or are used as displays of large products, such as televisions.

Display apparatuses include a plurality of pixels that receive electrical signals and emit light to display an image to the outside. Each of the plurality of pixels includes a display element. For example, in the case of organic light-emitting display apparatuses, each pixel includes an organic light-emitting diode (OLED) as a display element. In general, organic light-emitting display apparatuses have thin-film transistors and OLEDs formed on a substrate, and the OLEDs emit light by themselves.

Applications of display apparatuses have diversified, and also various design efforts for quality improvement of display apparatuses have been made.

SUMMARY

One or more embodiments include a display apparatus including contact holes formed to expose at least a portion of a conductive layer or a semiconductor layer without damage to the surface of the conductive layer or the semiconductor layer, and a method of manufacturing the display apparatus.

Additional aspects will be set forth in portion in the description which follows and, in part, will be apparent from the description, or may be learned by practice of the presented embodiments.

According to an embodiment, a display apparatus includes a substrate, a conductive mound arranged on the substrate, a first insulating mound arranged on the substrate, and a semiconductor layer including a first region arranged on the conductive mound, and a second region arranged on the first insulating mound. The second region of the semiconductor layer substantially covers an upper surface of the first insulating mound.

A vertical distance between a lower surface of the second region of the semiconductor layer and an upper surface of the substrate may be greater than a vertical distance between an upper surface of the conductive mound and the upper surface of the substrate.

The display apparatus may further include a second insulating mound between the conductive mound and the first region of the semiconductor layer.

A thickness of the first insulating mound may be greater than a thickness of the second insulating mound.

The first region of the semiconductor layer may substantially cover an upper surface of the second insulating mound.

The display apparatus may further include a display element, a driving transistor configured to control a magnitude of a driving current flowing to the display element, the driving transistor including the first region of the semiconductor layer, a scan transistor configured to transmit a data voltage to the driving transistor in response to a scan signal, the scan transistor including the second region of the semiconductor layer, and a storage capacitor having a first electrode and a second electrode, the second electrode connects to a gate of the driving transistor.

The driving transistor may further include a first gate electrode arranged on the first region of the semiconductor layer and at least partially overlapping the first region of the semiconductor layer, and the scan transistor may further include a second gate electrode arranged on the second region of the semiconductor layer and at least partially overlapping the second region of the semiconductor layer.

The display apparatus may further include a third insulating mound arranged on the substrate; and a gate driver configured to provide the scan signal, the gate driver including a transistor. The semiconductor layer may further include a third region arranged on the third insulating mound, and the transistor may include the third region of the semiconductor layer and a third gate electrode at least partially overlapping the third region of the semiconductor layer.

A vertical distance between a lower surface of the third region of the semiconductor layer and an upper surface of the substrate may be greater than a vertical distance between an upper surface of the conductive mound and the upper surface of the substrate.

A vertical distance between a lower surface of the third region of the semiconductor layer and an upper surface of the substrate may be substantially equal to a vertical distance between a lower surface of the second region of the semiconductor layer and the upper surface of the substrate.

The third insulating mound and the third region of the semiconductor layer may correspond to each other.

According to an embodiment, a display apparatus includes a substrate; a conductive mound arranged on the substrate; an organic planarization layer arranged on the substrate and at least partially covering the conductive mound; and a semiconductor layer arranged on the organic planarization layer and including a first semiconductor region overlapping the conductive mound and a second semiconductor region not overlapping the conductive mound.

A vertical distance between a lower surface of the second semiconductor region and an upper surface of the substrate may be greater than a vertical distance between an upper surface of the conductive mound and the upper surface of the substrate.

The display apparatus may further include a display element; a driving transistor configured to control a magnitude of a driving current flowing to the display element, the driving transistor including the first semiconductor region; a scan transistor configured to transmit a data voltage to the driving transistor in response to a scan signal, the scan transistor including the second semiconductor region; and a storage capacitor having a first electrode and a second electrode, the second electrode being connected to a gate of the driving transistor.

The driving transistor may further include a first gate electrode arranged on the first semiconductor region and at least partially overlapping the first semiconductor region, and the scan transistor may further include a second gate electrode arranged on the second semiconductor region and at least partially overlapping the second semiconductor region.

The display apparatus may further include a gate driver configured to provide the scan signal, the gate driver including a transistor. A display area and a peripheral area may be defined in the substrate. The driving transistor and the scan transistor may be arranged in the display area, and the gate driver may be arranged in the peripheral area. The semiconductor layer may further include a third semiconductor region arranged in the peripheral area, and the transistor may include the third semiconductor region and a third gate electrode at least partially overlapping the third semiconductor region.

A vertical distance between a lower surface of the third semiconductor region and an upper surface of the substrate may be greater than a vertical distance between an upper surface of the conductive mound and the upper surface of the substrate and may be substantially equal to a vertical distance between a lower surface of the second semiconductor region and the upper surface of the substrate.

The display apparatus may further include a conductive layer arranged on the substrate and including the conductive mound and a data line for transmitting the data voltage.

The organic planarization layer may cover a lateral surface of the conductive mound.

The organic planarization layer may include a first portion having a first thickness, and a second portion having a second thickness, the second thickness being less than the first thickness.

The second semiconductor region may be arranged in the first portion of the organic planarization layer.

According to an embodiment, a method of manufacturing a display apparatus includes forming a conductive mound on a substrate; forming a first insulating mound on the substrate; and forming a semiconductor layer including a first region arranged on the conductive mound, and a second region arranged on the first insulating mound, wherein the second region of the semiconductor layer substantially covers an upper surface of the first insulating mound.

The forming of the semiconductor layer may include forming a semiconductor material layer on the substrate; forming a photoresist pattern on the semiconductor material layer; and etching at least a portion of the semiconductor material layer by using the photoresist pattern as an etch mask. The forming of the first insulating mound may include forming an insulating material layer on the conductive mound; and etching at least a portion of the insulating material layer by using the photoresist pattern as an etch mask.

The method may further include forming a second insulating mound between the conductive mound and the first region of the semiconductor layer.

The forming of the first insulating mound may be performed simultaneously with the forming of the second insulating mound.

The forming of the semiconductor layer may include forming a semiconductor material layer on the substrate; forming a photoresist pattern on the semiconductor material layer; and etching at least a portion of the semiconductor material layer by using the photoresist pattern as an etch mask. The forming of the second insulating mound may include forming an insulating material layer on the conductive mound; and etching at least a portion of the insulating material layer by using the photoresist pattern as an etch mask.

These and other aspects will become apparent and more readily appreciated from the following description of the embodiments, the claims, and the accompanying drawings.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 5A, 5B, 5C, 5D, 5E, and 5F are cross-sectional views illustrating a method of manufacturing a display apparatus, according to an embodiment;

FIGS. 7A, 7B, 7C, and 7D are cross-sectional views illustrating a method of manufacturing a display apparatus, according to an embodiment;

DETAILED DESCRIPTION

Figure 1:
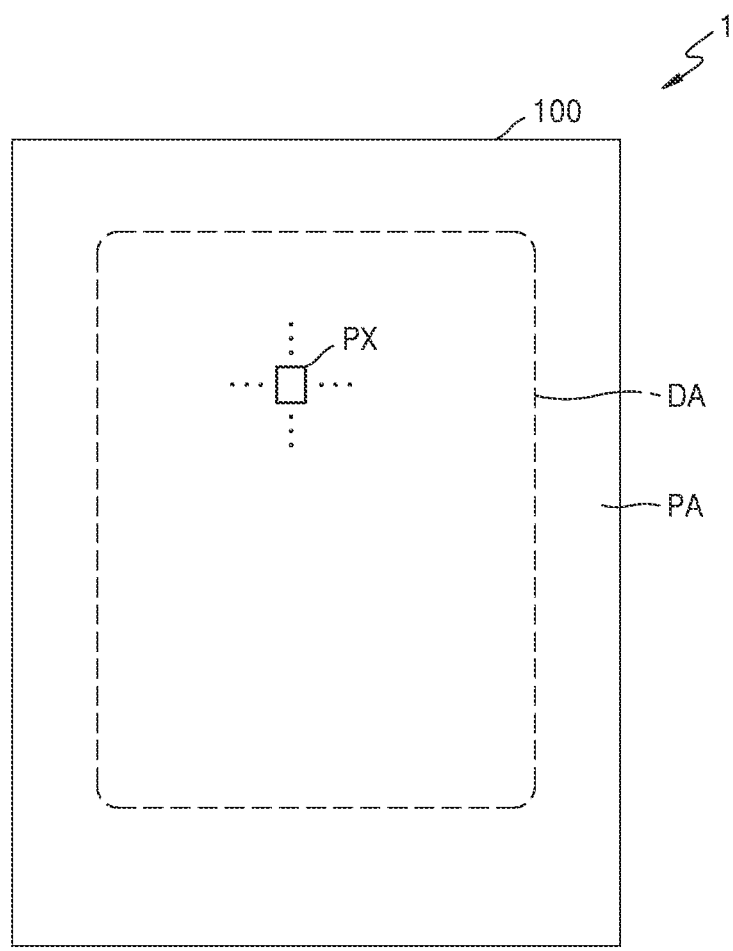
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

One or more embodiments of the disclosure will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

It will be further understood that the terms "comprises," "comprising," "includes," and including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, embodiments of the disclosure are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus 1 according to an embodiment.

Referring to FIG. 1, the display apparatus 1 includes a display area DA, where an image is displayed, and a peripheral area PA surrounding the display area DA. The display apparatus 1 may provide an image to the outside by using light emitted in the display area DA.

A substrate 100 may include any of various materials, such as glass, metal, or plastic. According to an embodiment, the substrate 100 may include a flexible material. The flexible material may be a material that is easily bent, curved, or folded or rolled. For example, the flexible material may be ultra-thin glass, metal, or plastic.

Pixels PX including various display elements such as an organic light-emitting diode (OLED) may be in the display area DA of the substrate 100. A plurality of pixels PX may be included, and the plurality of pixels PX may be arranged in any of various patterns such as a stripe pattern, a PenTile pattern, or a mosaic pattern to form an image.

In a plan view, the display area DA may have a rectangular shape, as shown in FIG. 1. In another embodiment, the display area DA may have a polygonal shape (e.g., a triangular shape, a pentagonal shape, or a hexagonal shape), a circular shape, an elliptical shape, or an irregular shape.

The peripheral area PA of the substrate 100 located around the display area DA may be an area where an image is not displayed. Various wirings for transmitting electrical signals to be applied to the display area DA, and pads to which a printed circuit board (PCB) or a driver integrated circuit (IC) chip is attached may be located in the peripheral area PA.

Figure 2:
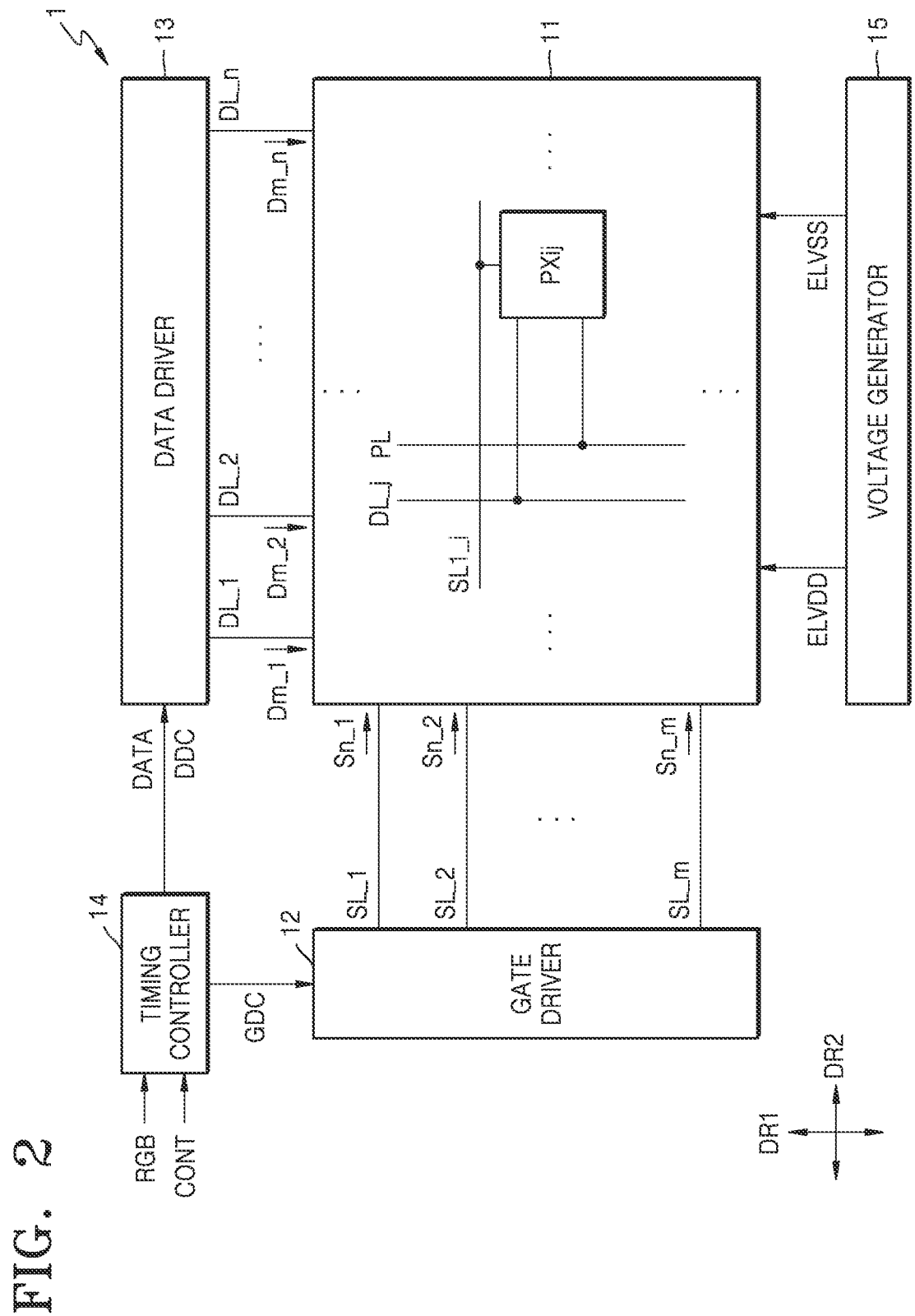
FIG. 2 is a schematic block diagram of a display apparatus according to an embodiment.

FIG. 2 is a schematic block diagram of the display apparatus 1 according to an embodiment.

The display apparatus 1 may be an organic light-emitting display including a display element of which luminance varies according to a current, for example, an OLED. Alternatively, the display apparatus 1 may be an inorganic light-emitting display or a quantum dot light-emitting display. In other words, an emission layer of the display element of the display apparatus 1 may include an organic material, an inorganic material, quantum dots, an organic material and quantum dots, an inorganic material and quantum dots, or an organic material, an inorganic material, and quantum dots. A case where the display apparatus 1 is an organic light-emitting display will now be focused on and described.

Referring to FIG. 2, the display apparatus 1 includes a display unit 11, a gate driver 12, a data driver 13, a timing controller 14, and a voltage generator 15. The display unit 11 is arranged in the display area DA of FIG. 1, and the gate driver 12, the data driver 13, the timing controller 14, and the voltage generator 15 are arranged in the peripheral area PA of FIG. 1.

The display unit 11 includes pixels PX such as a pixel PXij located on an i-th row and a j-th column. FIG. 2 illustrates only one pixel PXij for convenience of explanation, but m×n pixels PX may be arranged in, for example, a matrix form. Herein, i is a natural number in the range of 1 to m, and j is a natural number in the range of 1 to n.

Each pixel PX including two transistors and one capacitor is illustrated as an example in FIG. 2. However, the disclosure is equally applicable to not only pixels PX employing this specific pixel circuit but also pixels PX employing another pixel circuit, for example, a pixel circuit including three transistors and one capacitor, and pixels PX employing a pixel circuit including seven transistors and one capacitor.

The pixels PX are connected to scan lines SL_1 through SL_m, data lines DL_1 through DL_n, and a power line PL. For example, as shown in FIG. 2, the pixel PXij located on the i-th row and the j-th column may be connected to a scan line SL_i, a data line DL_j, and the power line PL.

The data lines DL_1 through DL_n may each extend in a first direction (or a column direction) DR1 and may be connected to pixels PX located on the same column. The scan lines SL_1 through SL_m may each extend in a second direction (or a row direction) DR2 and may be connected to pixels PX located on the same row.

The power line PL may include a plurality of vertical power lines each extending in the first direction DR1, and the plurality of vertical power lines may be connected to the pixels PX located on the same column. The power line PL may include a plurality of horizontal power lines each extending in the second direction DR2, and the plurality of horizontal power lines may be connected to the pixels PX located on the same row. The plurality of horizontal power lines and the plurality of vertical power lines may be connected to each other.

The scan lines SL_1 through SL_m transmit scan signals Sn_1 through Sn_m output by the gate driver 12 to the pixels PX located on the same row, respectively. The data lines DL_1 through DL_n transmit data voltages Dm_1 through Dm_n output by the data driver 13 to the pixels PX located on the same column, respectively. The pixel PXij located on the i-th row and the j-th column receives a scan signal Sn_i and a data voltage Dm_j.

The power line PL transmits a first driving voltage ELVDD output by the voltage generator 15 to the pixels PX.

The pixel PXij includes a display element, and a driving transistor that controls the magnitude of a current flowing to the display element, based on the data voltage Dm_j. The data voltage Dm_j is output to the data driver 13 and is received by the pixel PXij through the data line DL_j. The display element may be, for example, an OLED. The display element emits light with brightness corresponding to the magnitude of the current received from the driving transistor, so that the pixel PXij may represent a grayscale corresponding to the data voltage Dm_j. The pixel PX may correspond to a portion of a unit pixel capable of displaying a full color, for example, a subpixel. The pixel PXij may further include at least one switching transistor and at least one capacitor. The pixel PXij will be described in more detail below.

The voltage generator 15 may generate voltages necessary for driving the pixel PXij. For example, the voltage generator 15 may generate the first driving voltage ELVDD and a second driving voltage ELVSS. A level of the first driving voltage ELVDD may be higher than that of the second driving voltage ELVSS.

Although not shown in FIG. 2, the voltage generator 15 may generate an initialization voltage and provide the initialization voltage to the pixels PX. The initialization voltage may be applied to a gate of the driving transistor or an anode of the display element.

Although not shown in FIG. 2, the voltage generator 15 may generate a first gate voltage VGH and a second gate voltage VGL for controlling a switching transistor of the pixel PXij and may provide the first gate voltage VGH and the second gate voltage VGL to the gate driver 12. The switching transistor may be turned on when the first gate voltage VGH is applied to the gate of the switching transistor, and the switching transistor may be turned off when the second gate voltage VGL is applied to the gate of the switching transistor. The first gate voltage VGH may be referred to as a turn-on voltage, and the second gate voltage VGL may be referred to as a turn-off voltage. Switching transistors of the pixel PXij may be n-type MOSFETs, and a level of the first gate voltage VGH may be higher than that of the second gate voltage VGL. Although not shown in FIG. 2, the voltage generator 15 may generate gamma reference voltages and provide the gamma reference voltages to the data driver 13.

The timing controller 14 may control the display unit 11 by controlling operational timings of the gate driver 12 and the data driver 13. The pixels PX of the display unit 11 may receive a new data voltage Dm for each frame period, and may display an image corresponding to image source data RGB of one frame by emitting light with luminance corresponding to the data voltage Dm.

The timing controller 14 receives the image source data RGB and a control signal CONT from an external source. The timing controller 14 may convert the image source data RGB into image data DATA, based on characteristics of the display unit 11 and the pixels PX. The timing controller 14 may provide the image data DATA to the data driver 13.

The control signal CONT may include a vertical synchronization signal Vsync, a horizontal synchronization signal Hsync, a data enable signal DE, and a clock signal CLK. The timing controller 14 may control the operational timings of the gate driver 12 and the data driver 13 by using the control signal CONT. The timing controller 14 may determine a frame period by counting the data enable signal DE of a horizontal scanning period. In this case, the vertical synchronization signal Vsync and the horizontal synchronization signal Hsync supplied from an external source may be omitted. The image source data RGB includes luminance information of the pixels PX. Luminance may have a predetermined number of gray levels, for example, 1024 ($=2^{10}$), 256($=2^8$), or 64($=2^6$) gray levels.

The timing controller 14 may generate control signals including a gate timing control signal GDC for controlling the operational timing of the gate driver 12, and a data timing control signal DDC for controlling the operational timing of the data driver 13.

The gate timing control signal GDC may include a gate start pulse (GSP), a gate shift clock (GSC), and a gate output enable (GOE) signal. The GSP is provided to the gate driver 12 generating a first scan signal at a start time point of a scanning period. The GSC, which is a clock signal that is commonly input to the gate driver 12, shifts the GSP. The GOE signal controls an output of the gate driver 12.

The data timing control signal DDC may include a source start pulse (SSP), a source sampling clock (SSC), and a source output enable (SOE) signal. The SSP controls a data sampling start time point of the data driver 13 and is provided to the data driver 13 at the start time point of the scanning period. The SSC is a clock signal that controls a sampling operation of data within the data driver 13, based on a rising or falling edge. The SOE signal controls an output of the data driver 13. The SSP provided to the data driver 13 may be omitted according to data transmission methods.

The gate driver 12 sequentially generates the scan signals Sn_1 through Sn_m in response to the gate timing control signal GDC supplied by the timing controller 14 by using the first and second gate voltages VGH and VGL provided by the voltage generator 15. The gate driver 12 may include a plurality of transistors and may be formed together with the pixels PX through a thin film process. For example, the gate driver 12 may be mounted in the form of an Amorphous Silicon TFT Gate driver circuit (ASG) or an Oxide Semiconductor TFT Gate driver circuit (OSG) in the peripheral area PA.

The data driver 13 samples and latches the image data DATA supplied by the timing controller 14 in response to the data timing control signal DDC supplied from the timing controller 14 to convert the image data DATA into data of a parallel data system. When converting the image data DATA into data of a parallel data system, the data driver 13 converts the image data DATA into a gamma reference signal, namely, an analog data voltage. The data driver 13 provides the data voltage Dm_1 through Dm_n to the pixels PX through the data lines DL_1 through DL_n. The pixels PX receive the data voltage Dm_1 through Dm_n in response to the scan signals Sn_1 through Sn_m.

Figure 3:
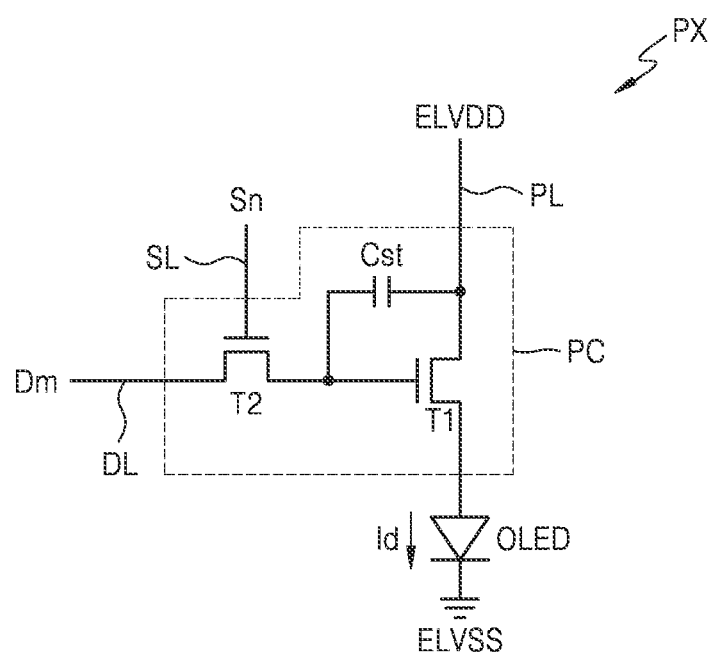
FIG. 3 is an equivalent circuit diagram of a pixel of a display apparatus according to an embodiment.

FIG. 3 is an equivalent circuit diagram of a pixel of a display apparatus according to an embodiment.

Referring to FIG. 3, each pixel PX may include a pixel circuit PC connected to a scan line SL and a data line DL, and a display element connected to the pixel circuit PC. The display element may be an OLED including an anode and a cathode. The cathode of the OLED may be a common electrode to which the second driving voltage ELVSS is applied.

The pixel circuit PC may include a first transistor T1, a second transistor T2, and a storage capacitor Cst.

The first transistor T1 may be a driving transistor in which the magnitude of a drain current is determined according to a gate-source voltage, and the second transistor T2 may be a switching transistor that is turned on/off according to a gate-source voltage, substantially, a gate voltage. The first transistor T1 and the second transistor T2 may be implemented using thin-film transistors.

The first transistor T1 may be referred to as a driving transistor, and the second transistor T2 may be referred to as a scan transistor.

A storage capacitor Cst is connected between the power line PL and a gate of the driving transistor T1. The storage capacitor Cst may have a second electrode connected to the power line PL, and a first electrode connected to the gate of the driving transistor T1. The storage capacitor Cst may store a voltage corresponding to a difference between a voltage received from the scan transistor T2 and the first driving voltage ELVDD supplied to the voltage line PL.

The driving transistor T1 may control the magnitude of a current Id flowing from the voltage line PL to the OLED according to the gate-source voltage. The OLED may emit light having a certain luminance due to the driving current 1d. The driving transistor T1 may have a gate connected to a first electrode of the storage capacitor Cst, a drain connected to the power line PL, and a source connected to the OLED.

The scan transistor T2 may transmit the data voltage Dm to the gate of the driving transistor T1 in response to a scan signal Sn. The scan transistor T2 may have a gate connected to the scan line SL, a drain connected to the data line DL, and a source connected to the gate of the driving transistor T1.

Although a case where the pixel circuit PC includes two transistors and one storage capacitor is illustrated in FIG. 3, embodiments are not limited thereto. For example, the pixel circuit PC may include three or more transistors, or two or more storage capacitors. According to another embodiment, the pixel circuit PC may include three transistors and one storage capacitor. According to another embodiment, the pixel circuit PC may include seven transistors and one storage capacitor.

Figure 4:
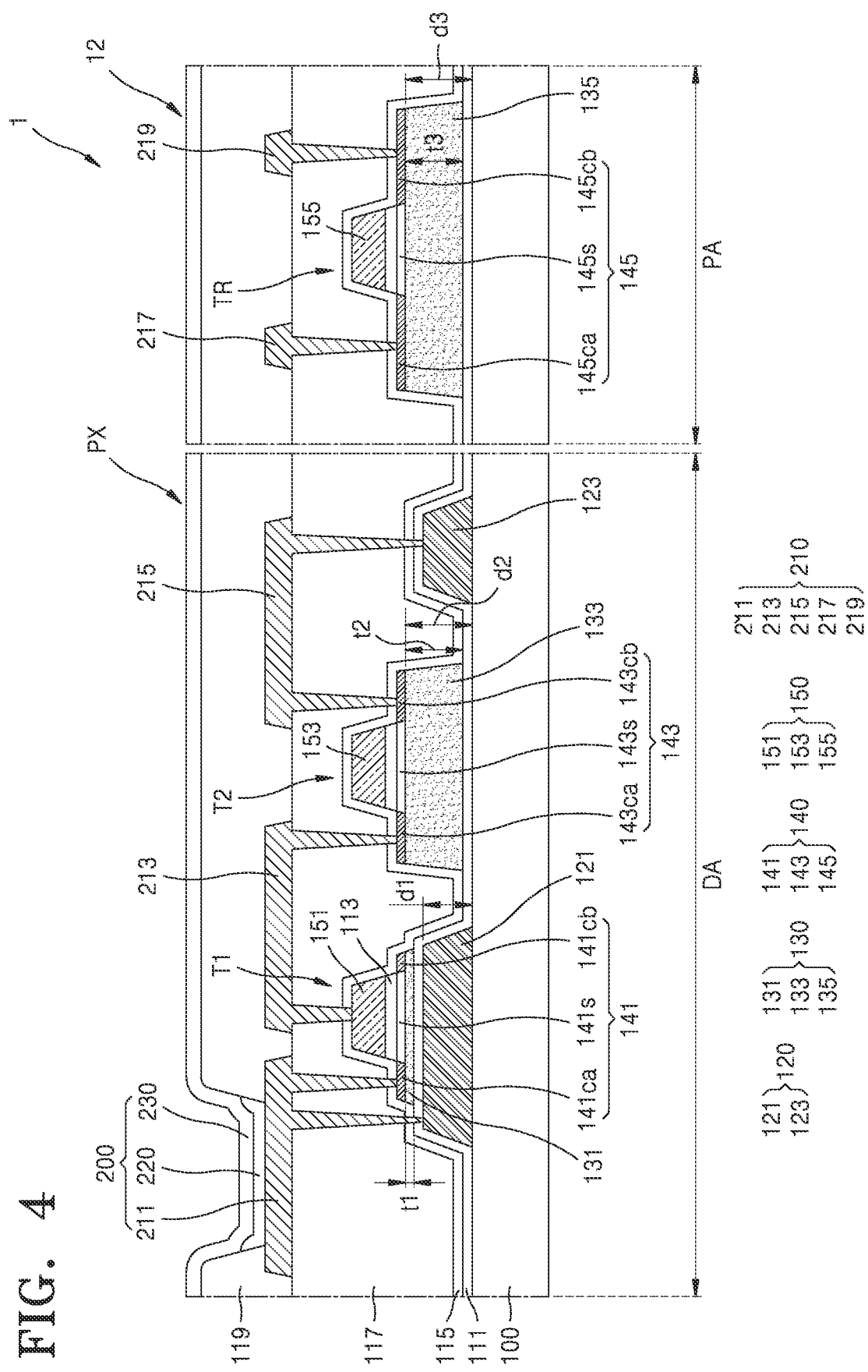
FIG. 4 is a schematic cross-sectional view of a display apparatus according to an embodiment.

FIG. 4 is a schematic cross-sectional view of the display apparatus 1 according to an embodiment. FIG. 4 illustrates a cross-section of the display apparatus 1 from which some elements are omitted.

Referring to FIG. 4, the display apparatus 1 may include the substrate 100, the pixel PX, and the gate driver 12. The display area DA and the peripheral area PA may be defined in the substrate 100. In other words, the substrate 100 may include the display area DA and the peripheral area PA. The pixel PX may be arranged in the display area DA, and the gate driver 12 may be arranged in the peripheral area PA.

The pixel PX may include the driving transistor T1 and the scan transistor T2. The driving transistor T1 may include a first region 141 of a semiconductor layer 140 and a first gate electrode 151, and the scan transistor T2 may include a second region 143 of the semiconductor layer 140 and a second gate electrode 153. The first region 141 of the semiconductor layer 140 and the first gate electrode 151 may at least partially overlap each other, and the second region 143 of the semiconductor layer 140 and the second gate electrode 153 may at least partially overlap each other.

The gate driver 12 may include a transistor TR. The transistor TR may include a third region 145 of the semiconductor layer 140 and a third gate electrode 155. The third region 145 of the semiconductor layer 140 and the third gate electrode 155 may at least partially overlap each other. FIG. 4 illustrates a single transistor TR. However, according to another embodiment, the gate driver 12 may include a plurality of transistors TR.

The display apparatus 1 may include a first conductive layer 120 and a first insulating layer 130 between the substrate 100 and the semiconductor layer 140. The first conductive layer 120 may include a conductive mound 121 arranged below the driving transistor T1. The first insulating layer 130 may include a first insulating mound 131 arranged below the driving transistor T1, a second insulating mound 133 arranged below the scan transistor T2, and a third insulating mound 135 arranged below the transistor TR.

Figure 5B:
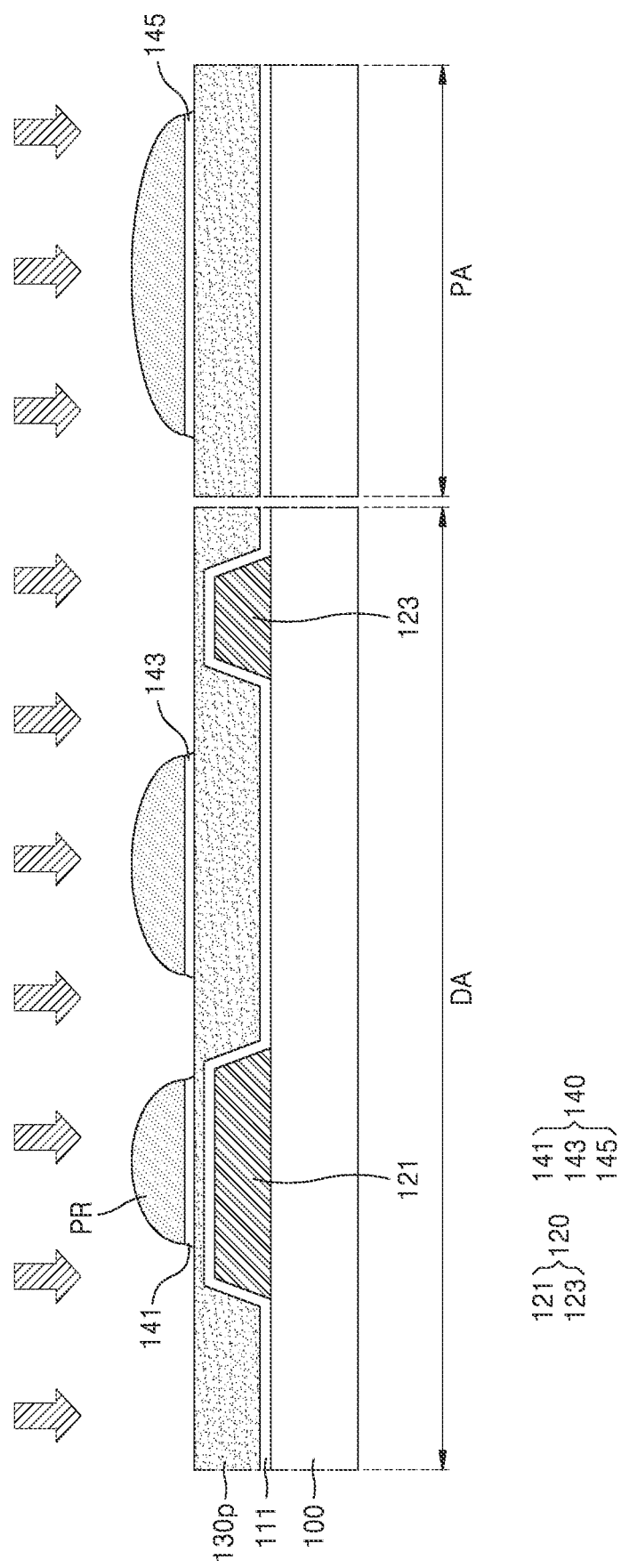
Figure 5C:
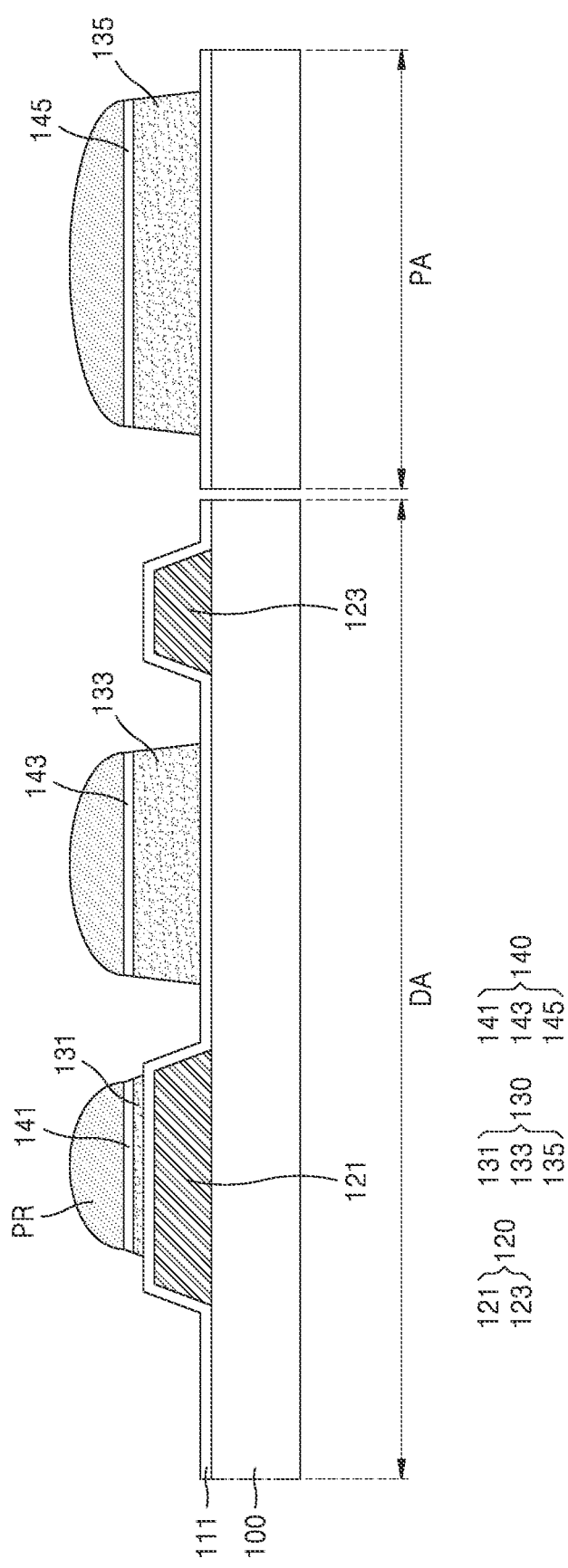

The first insulating mound 131 and the first region 141 of the semiconductor layer 140 may correspond to each other. Because the first insulating mound 131 and the first region 141 of the semiconductor layer 140 are formed using the same photoresist pattern PR as shown in FIGS. 5B and 5C to be described later, a planar shape of the first insulating mound 131 may substantially correspond to that of the first region 141 of the semiconductor layer 140.

The second insulating mound 133 and the second region 143 of the semiconductor layer 140 may correspond to each other. Because the second insulating mound 133 and the second region 143 of the semiconductor layer 140 are formed using the same photoresist pattern PR as shown in FIGS. 5B and 5C to be described below, a planar shape of the second insulating mound 133 may substantially correspond to that of the second region 143 of the semiconductor layer 140.

The third insulating mound 135 and the third region 145 of the semiconductor layer 140 may correspond to each other. Because the third insulating mound 135 and the third region 145 of the semiconductor layer 140 are formed using the same photoresist pattern PR as shown in FIGS. 5B and 5C to be described below, a planar shape of the third insulating mound 135 may substantially correspond to that of the third region 145 of the semiconductor layer 140.

According to an embodiment, a vertical distance d2 between a lower surface of the second region 143 of the semiconductor layer 140 and an upper surface of the substrate 100 may be greater than a vertical distance d1 between an upper surface of the conductive mound 121 and the upper surface of the substrate 100. In other words, the vertical distance d2 between an upper surface of the second insulating mound 133 and the upper surface of the substrate 100 may be greater than the vertical distance d1 between the upper surface of the conductive mound 121 and the upper surface of the substrate 100.

According to an embodiment, a vertical distance d3 between a lower surface of the third region 145 of the semiconductor layer 140 and the upper surface of the substrate 100 may be greater than the vertical distance d1 between the upper surface of the conductive mound 121 and the upper surface of the substrate 100. In other words, the vertical distance d3 between an upper surface of the third insulating mound 135 and the upper surface of the substrate 100 may be greater than the vertical distance d1 between the upper surface of the conductive mound 121 and the upper surface of the substrate 100.

According to an embodiment, the vertical distance d3 between the lower surface of the third region 145 of the semiconductor layer 140 and the upper surface of the substrate 100 may be substantially equal to the vertical distance d2 between the lower surface of the second region 143 of the semiconductor layer 140 and the upper surface of the substrate 100. In other words, the vertical distance d3 between the upper surface of the third insulating mound 135 and the upper surface of the substrate 100 may be substantially equal to the vertical distance d2 between the upper surface of the second insulating mound 133 and the upper surface of the substrate 100.

According to a comparative example, the first insulating layer 130 may not be arranged below the semiconductor layer 140. Because the second insulating mound 133 is not arranged below the second region 143 of the semiconductor layer 140, the vertical distance d1 between the upper surface of the conductive mound 121 and the upper surface of the substrate 100 is significantly greater than a vertical distance between the lower surface of the second region 143 of the semiconductor layer 140 and the upper surface of the substrate 100. In other words, a depth of a contact hole exposing the second region 143 of the semiconductor layer 140 is significantly greater than that of a contact hole exposing the conductive mound 121. Accordingly, while an etch process of forming the contact hole exposing the second region 143 of the semiconductor layer 140 is being conducted, the conductive mound 121 is excessively etched, and thus, a surface of the conductive mound 121 may be damaged. The contact hole exposing the conductive mound 121 may be excessively etched.

However, when the first insulating layer 130 having a thickness that is substantially equal to a thickness of the first conductive layer 120 is arranged below the semiconductor layer 140, the vertical distance d1 between the upper surface of the conductive mound 121 and the upper surface of the substrate 100 may be substantially equal to the vertical distance d2 between the upper surface of the second insulating mound 133 and the upper surface of the substrate 100. In other words, respective depths of a plurality of contact holes penetrating through at least one of a buffer layer 111, a second insulating layer 115, and a third insulating layer 117 may be substantially equal to one another. The respective depths of the plurality of contact holes being substantially equal to one another may mean that the respective depths difference of the plurality of contact holes are within a range where a surface of a conductive layer or semiconductor layer exposed by the contact hole is not damaged. Accordingly, the respective depths of the plurality of contact holes may be adjusted to be substantially equal to one another through the first insulating layer 130 so that the surface of the conductive layer or the surface of the semiconductor layer is not damaged during an etch process for forming the contact holes.

Elements included in the display apparatus 1 will now be described in more detail according to a stacked structure with reference to FIG. 4.

The substrate 100 may include a glass material, a metal material, or a flexible or bendable material. When the substrate 100 is flexible or bendable, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single or multi-layer structure of the aforementioned materials, and, when the substrate 100 has a multi-layer structure, the substrate 100 may further include an inorganic layer. In some embodiments, the substrate 100 may have a structure of organic material/inorganic material/organic material.

The buffer layer 111 may reduce or prevent infiltration of a foreign material, moisture, or ambient air from below the substrate 100 and may provide a flat surface to the substrate 100. The buffer layer 111 may include an inorganic material (such as oxide or nitride), an organic material, or an organic and inorganic compound, and may be a single layer or multiple layers of an inorganic material and an organic material.

A barrier layer (not shown) may be included between the substrate 100 and the buffer layer 111. The barrier layer may prevent or minimize infiltration of impurities from the substrate 100 and the like into the semiconductor layer 140. The barrier layer may include an inorganic material (such as oxide or nitride), an organic material, or an organic and inorganic compound, and may be formed as a single layer or multiple layers of an inorganic material and an organic material.

The semiconductor layer 140 may be on the buffer layer 111. The semiconductor layer 140 may have a single-layer or multi-layer structure.

According to an embodiment, the semiconductor layer 140 may include an oxide semiconductor material. The semiconductor layer 140 may include oxide of at least one selected from the group consisting of, for example, indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer 140 may be an InSnZnO (ITZO) semiconductor layer, an InGaZnO (IGZO) semiconductor layer, or the like. Because an oxide semiconductor has a wide band gap (of about 3.1 eV), a high carrier mobility, and a low leakage current, a voltage drop is not large even in case that a driving time is long. Accordingly, a luminance change due to a voltage drop is not large even during low-frequency operation.

According to another embodiment, the semiconductor layer 140 may include amorphous silicon or poly silicon.

The semiconductor layer 140 may include a semiconductor region, and conductive regions respectively arranged on both sides of the semiconductor region. For example, the first region 141 of the semiconductor layer 140 may include a first semiconductor region 141$s$, and a first conductive region 141$ca$ and a second conductive region 141$cb$ respectively arranged on both sides of the first semiconductor region 141$s$. The second region 143 of the semiconductor layer 140 may include a second semiconductor region 143$s$, and a third conductive region 143$ca$ and a fourth conductive region 143$cb$ respectively arranged on both sides of the second semiconductor region 143$s$. The third region 145 of the semiconductor layer 140 may include a third semiconductor region 145$s$, and a fifth conductive region 145$ca$ and a sixth conductive region 145$cb$ respectively arranged on both sides of the third semiconductor region 145$s$.

The first conductive layer 120 may be arranged between the substrate 100 and the buffer layer 111. The first conductive layer 120 may include a conductive material including molybdenum (Mo), aluminum (Al), copper (Cu), and titanium (Ti), and may be a multi-layer or single layer including the aforementioned materials. For example, the first conductive layer 120 may have a multi-layer structure of Ti/Al/Ti.

The first conductive layer 120 may include the conductive mound 121 and a data line 123.

The conductive mound 121 may at least partially overlap the driving transistor T1. The conductive mound 121 may at least partially overlap the first region 141 of the semiconductor layer 140. The conductive mound 121 may at least overlap the first semiconductor region 141$s$ of the first region 141 of the semiconductor layer 140.

When the semiconductor layer 140 includes an oxide semiconductor material, the semiconductor layer 140 may have characteristics that are weak to light. The conductive mound 121 may prevent a change in device characteristics of the driving transistor T1 due to induction of a photocurrent in the first region 141 of the semiconductor layer 140 by external light incident upon the substrate 100.

The conductive mound 121 may be connected to the driving transistor T1. For example, as shown in FIG. 4, the conductive mound 121 may be connected to the first region 141 of the semiconductor layer 140. The conductive mound 121 may be connected to the first conductive region 141ca of the first region 141 of the semiconductor layer 140.

The data line 123 may correspond to the data line DL of FIG. 3, and may be connected to the scan transistor T2. For example, as shown in FIG. 4, the data line 123 may be connected to the second region 143 of the semiconductor layer 140. The data line 123 may be connected to the fourth conductive region 143cb of the second region 143 of the semiconductor layer 140.

According to an embodiment, as shown in FIG. 4, a thickness of the first conductive layer 120 may be greater than that of the semiconductor layer 140. Because resistance of the data line 123 transmitting a data voltage when the first conductive layer 120 is thick, even when resolution of the display apparatus 1 increases, an RC delay of the display apparatus 1 may be maintained or reduced.

The first insulating layer 130 may be arranged between the buffer layer 111 and the semiconductor layer 140.

According to an embodiment, the first insulating layer 130 may be a single layer including an organic material or a multi-layer formed by stacking single layers each including an organic material. For example, the first insulating layer 130 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

According to another embodiment, the first insulating layer 130 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The first insulating layer 130 may include an insulating mound. For example, as shown in FIG. 4, the first insulating layer 130 may include the first insulating mound 131 corresponding to the first region 141 of the semiconductor layer 140, the second insulating mound 133 corresponding to the second region 143 of the semiconductor layer 140, and the third insulating mound 135 corresponding to the third region 145 of the semiconductor layer 140.

When the first insulating layer 130 includes an organic material, the first insulating layer 130 may provide a flat upper surface. Accordingly, according to whether the first conductive layer 120 is arranged below the first insulating layer 130, the insulating mounds of the first insulating layer 130 may have different thicknesses. An insulating mound at least partially overlapping the first conductive layer 120 may be less than an insulating mound not overlapping the first conductive layer 120. For example, the conductive mound 121 may be arranged below the first insulating mound 131. The first insulating mound 131 and the conductive mound 121 may at least partially overlap each other. A thickness t1 of the first insulating mound 131 may be less than a thickness t2 of the second insulating mound 133. The thickness t1 of the first insulating mound 131 may be less than a thickness t3 of the third insulating mound 135. The thickness t2 of the second insulating mound 133 may be substantially equal to the thickness t3 of the third insulating mound 135.

A gate insulating layer 113 may be arranged on the semiconductor layer 140. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

According to an embodiment, as shown in FIG. 4, the gate insulating layer 113 may be patterned to overlap a portion of the semiconductor layer 140. For example, the gate insulating layer 113 may be patterned to expose the conductive regions (for example, the first through sixth conductive regions 141ca, 141cb, 143ca, 143cb, 145ca, and 145cb) of the semiconductor layer 140. A lateral surface of the gate insulating layer 113 may correspond to a lateral surface of a gate electrode (for example, the first through third gate electrodes 151, 153, and 155) of a gate electrode layer 150.

A region of the semiconductor layer 140 that overlaps the gate insulating layer 113 may be understood as a semiconductor region. The conductive regions of the semiconductor layer 140 are subjected to a conductivity increasing process such as plasma treatment, and a portion of the semiconductor layer 140 overlapping the gate insulating layer 113 (i.e., the semiconductor region of the semiconductor layer 140) is not exposed to the plasma treatment and thus has properties different from those of the conductive regions. In other words, by using the gate electrode of the gate electrode layer 150 located over the gate insulating layer 113 as a self-alignment mask during the plasma treatment of the semiconductor layer 140, the semiconductor region not subjected to the plasma treatment may be formed at a position overlapping the gate insulating layer 113 and the conductive regions subjected to the plasma treatment may be respectively formed on both sides of the semiconductor region.

In FIG. 4, the gate insulating layer 113 is patterned to overlap a portion of the semiconductor layer 140. However, according to another embodiment, the gate insulating layer 113 may be arranged on the entire surface of the semiconductor layer 140 to cover the semiconductor layer 140.

The gate electrode layer 150 may be arranged on the gate insulating layer 113 to at least partially overlap the semiconductor layer 140. For example, the gate electrode layer 150 may include the first gate electrode 151 at least partially overlapping the first region 141 of the semiconductor layer 140, the second gate electrode 153 at least partially overlapping the second region 143 of the semiconductor layer 140, and the third gate electrode 155 at least partially overlapping the third region 145 of the semiconductor layer 140.

The gate electrode layer 150 may include at least one of aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and copper (Cu) and may have a single-layered or multi-layered structure.

The second insulating layer 115 may cover the buffer layer 111, the first insulating layer 130, the semiconductor layer 140, and the gate electrode layer 150. The second insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The third insulating layer 117 may be arranged on the second insulating layer 115, and an OLED 200 may be arranged as a display element on the third insulating layer 117. The OLED 200 includes a pixel electrode 211, an intermediate layer 220, and an opposite electrode 230.

The third insulating layer 117 may be a single layer including an organic material or a multi-layer formed by stacking single layers each including an organic material, and provide a flat upper surface. The third insulating layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

A second conductive layer 210 may be arranged on the third insulating layer 117. The second conductive layer 210 may be a (semi) light-transmissive electrode or a reflective electrode. According to some embodiments, the second conductive layer 210 may include a reflective layer formed of silver (Ag), magnesium (Mg), aluminum (Al), platinum (Pt), palladium (Pd), gold (Au), nickel (Ni), neodymium (Nd), iridium (Jr), chromium (Cr), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the second conductive layer 210 may have a stack structure of ITO/Ag/ITO.

The second conductive layer 210 may include the pixel electrode 211 of the OLED 200, a first electrode 213, a second electrode 215, a third electrode 217, and a fourth electrode 219.

The pixel electrode 211 may be connected to the conductive mound 121 through contact holes formed in the buffer layer 111, the second insulating layer 115, and the third insulating layer 117, and may be connected to the first conductive region 141ca of the driving transistor T1 through contact holes formed in the second insulating layer 115 and the third insulating layer 117.

The first electrode 213 may be connected to the gate of the driving transistor T1 through the contact holes formed in the second insulating layer 115 and the third insulating layer 117, and may be connected to the third conductive region 143a of the scan transistor T2 through the contact holes formed in the second insulating layer 115 and the third insulating layer 117.

The second electrode 215 may be connected to the fourth conductive region 143cb of the scan transistor T2 through the contact holes formed in the second insulating layer 115 and the third insulating layer 117, and may be connected to the data line DL through the contact holes formed in the buffer 111, the second insulating layer 115, and the third insulating layer 117.

The third electrode 217 and the fourth electrode 219 may be connected to the fifth conductive region 145ca and the sixth conductive region 145cb, respectively, of the transistor TR through the contact holes formed in the second insulating layer 115 and the third insulating layer 117. Although FIG. 4 illustrates both the third electrode 217 and the fourth electrode 219, at least one of the third electrode 217 and the fourth electrode 219 may be omitted.

A pixel defining layer 119 may be arranged on the third insulating layer 117. The pixel defining layer 119 may prevent an electric arc or the like from occurring on an edge of the pixel electrode 211 by increasing a distance between the edge of the pixel electrode 211 and the opposite electrode 230 over the pixel electrode 211.

The pixel defining layer 119 may be formed of at least one organic insulating material selected from the group consisting of polyimide, polyamide, acryl resin, benzocyclobutene, and a phenolic resin, by using a method such as spin coating. The pixel defining layer 119 may include an organic insulating material. Alternatively, the pixel defining layer 119 may include an inorganic insulating material such as silicon nitride, silicon oxynitride, or silicon oxide. Alternatively, the pixel defining layer 119 may include an organic insulating material and an inorganic insulating material. According to some embodiments, the pixel defining layer 119 may include a light shielding material, and may have a black color. The light shielding material may include carbon black, carbon nanotubes, resin or paste including a black pigment, metal particles (e.g., nickel, aluminum, molybdenum, and an alloy thereof), metal oxide particles (e.g., chromium oxide), or metal nitride particles (e.g., chromium nitride). When the pixel defining layer 119 includes a light shielding material, external light reflection due to metal structures arranged under the pixel defining layer 119 may be reduced.

The intermediate layer 220 of the OLED 200 may include an organic emission layer. The organic emission layer may include an organic material including a fluorescent or phosphorescent material that emits red, green, blue, or white light. The organic emission layer may include a low molecular weight organic material or a high molecular weight organic material, and one or more functional layers, such as a hole transport layer (HTL), a hole injection layer (HIL), an electron transport layer (ETL), and an electron injection layer (EIL), may be further arranged below and above the organic emission layer. The intermediate layer 220 may be arranged to correspond to each of a plurality of pixel electrodes 211. However, embodiments are not limited thereto. Various modifications may be made to the intermediate layer 220. For example, the intermediate layer 220 may include an integrated layer over the plurality of pixel electrodes 211.

The opposite electrode 230 may be a light-transmissive electrode or a reflective electrode. According to some embodiment, the opposite electrode 230 may be a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including, for example, ITO, IZO, ZnO, or $In_2O_3$, may be further arranged on the metal thin film. The opposite electrode 230 may extend over the display area DA, and may be arranged on the intermediate layer 220 and the pixel defining layer 119. The opposite electrode 230 may be formed as a single body that constitutes a plurality of OLEDs 200, and thus may correspond to the plurality of pixel electrodes 211.

Because the OLEDs 200 may be easily damaged by external moisture, oxygen, or the like, an encapsulation layer (not shown) may cover and protect the OLEDs 200. The encapsulation layer may cover the display area DA and may extend to at least a portion of the peripheral area PA. The encapsulation layer may include a first inorganic encapsulation layer, an organic encapsulation layer, and a second inorganic encapsulation layer.

FIGS. 5A through 5F are cross-sectional views illustrating a method of manufacturing the display apparatus 1 of FIG. 4, according to an embodiment. Reference numerals in FIGS. 5A through 5F that are the same as those in FIG. 4 denote the same members, and thus, repeated descriptions thereof are omitted.

First, referring to FIG. 5A, the first conductive layer 120 including the conductive mound 121 and the data line 123 is formed on the substrate 100.

The first conductive layer 120 may be formed by patterning a first conductive material layer (not shown). The first conductive material layer may include a conductive material including molybdenum (Mo), aluminum (Al), copper (Cu), and titanium (Ti), and may be a multi-layer or single layer including the aforementioned materials.

After the first conductive layer 120 is formed, the buffer layer 111 is formed on the first conductive layer 120.

The buffer layer 111 may include silicon oxide ($SiO_2$) or silicon nitride ($SiN_x$), and may be formed using a deposition method such as chemical vapor deposition (CVD) or sputtering.

After the buffer layer 111 is formed, an insulating material layer 130p, a semiconductor material layer 140p, and a photoresist pattern PR are sequentially formed on the buffer layer 111.

The insulating material layer 130p may include an organic material or an inorganic material. The insulating material layer 130p may be formed by CVD, sputtering, spin coating, or the like.

The semiconductor material layer 140p may include an oxide semiconductor material, amorphous silicon, or polysilicon. The semiconductor material layer 140p may be deposited by CVD or the like.

The photoresist pattern PR may be formed by forming a positive photoresist layer or a negative photoresist layer by coating the semiconductor material layer 140p with a positive photoresist solution or a negative photoresist solution by using any of various methods such as spin coating, spraying, or dipping, and then partially removing the positive photoresist layer or the negative photoresist layer through a developing process.

Referring to FIGS. 5A and 5B, a portion of the semiconductor material layer 140p is etched using the photoresist pattern PR formed on the semiconductor material layer 140p to thereby form the semiconductor layer 140. The semiconductor layer 140 may be formed by depositing the semiconductor material layer 140p and performing a mask process and an etching process. For example, the etching process may be a wet etching process.

The semiconductor layer 140 may include the first region 141, the second region 143, and the third region 145 respectively corresponding to photoresist patterns PR.

Referring to FIGS. 5B and 5C, a portion of the insulating material layer 130p is etched using the photoresist pattern PR formed on the insulating material layer 130p, and the first insulating layer 130 is formed. The first insulating layer 130 may be formed by depositing the insulating material layer 130p and performing a mask process and an etching process. For example, the etching process may be a dry etching process.

The first insulating layer 130 may include the first insulating mound 131, the second insulating mound 133, and the third insulating mound 135 respectively corresponding to the photoresist patterns PR.

As such, the first insulating mound 131 and the first region 141 of the semiconductor layer 140 are formed using the same photoresist pattern PR, the second insulating mound 133 and the second region 143 of the semiconductor layer 140 are formed using the same photoresist pattern PR, and the third insulating mound 135 and the third region 145 of the semiconductor layer 140 are formed using the same photoresist pattern PR, and thus, the first insulating mound 131 and the first region 141 of the semiconductor layer 140 may correspond to each other, the second insulating mound 133 and the second region 143 of the semiconductor layer 140 may correspond to each other, and the third insulating mound 135 and the third region 145 of the semiconductor layer 140 may correspond to each other.

Figure 5D:
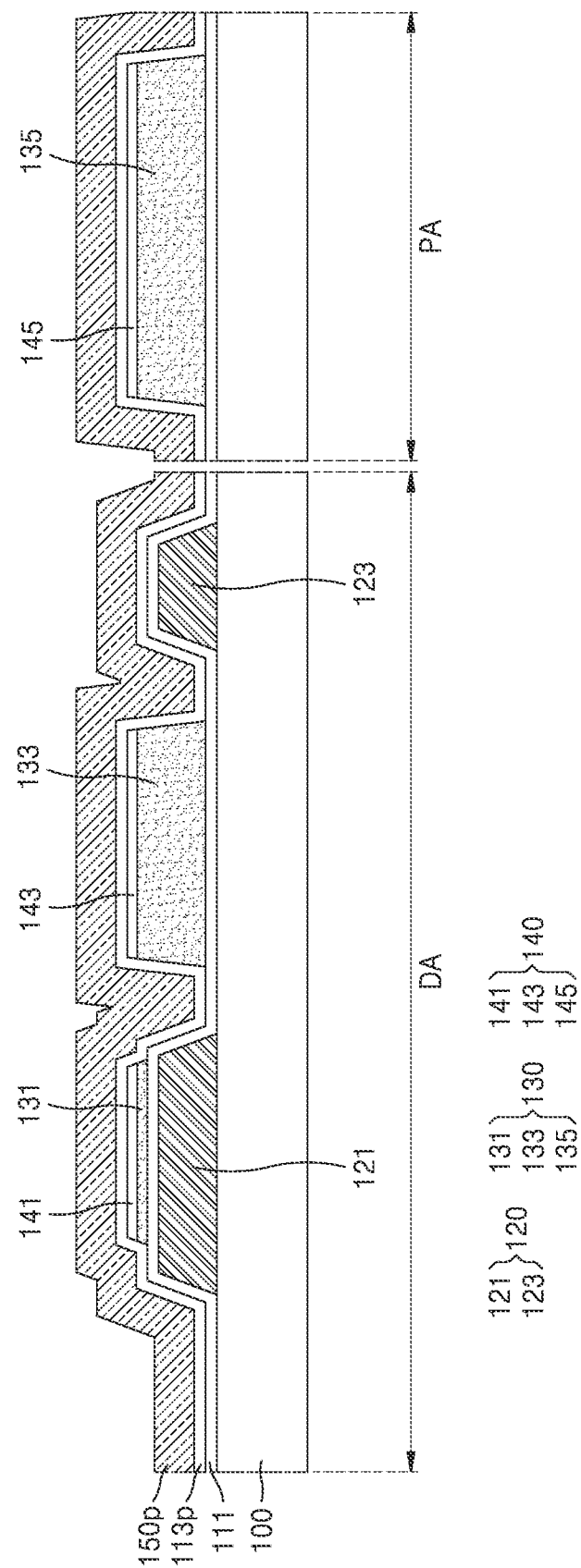

Referring to FIG. 5D, after the photoresist pattern PR is removed, a gate insulating material layer 113p and a gate electrode material layer 150p are sequentially formed on the semiconductor layer 140.

The gate insulating material layer 113p may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The gate insulating material layer 113p may be formed by CVD, sputtering, spin coating, or the like.

The gate electrode material layer 150p may include at least one metal selected from aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and copper (Cu) and may have a single-layered or multi-layered structure. The gate electrode material layer 150p may be formed by using a deposition method such as CVD, plasma enhanced CVD (PECVD), low pressure CVD (LPCVD), physical vapor deposition (PVD), sputtering, atomic layer deposition (ALD), or the like.

Figure 5E:
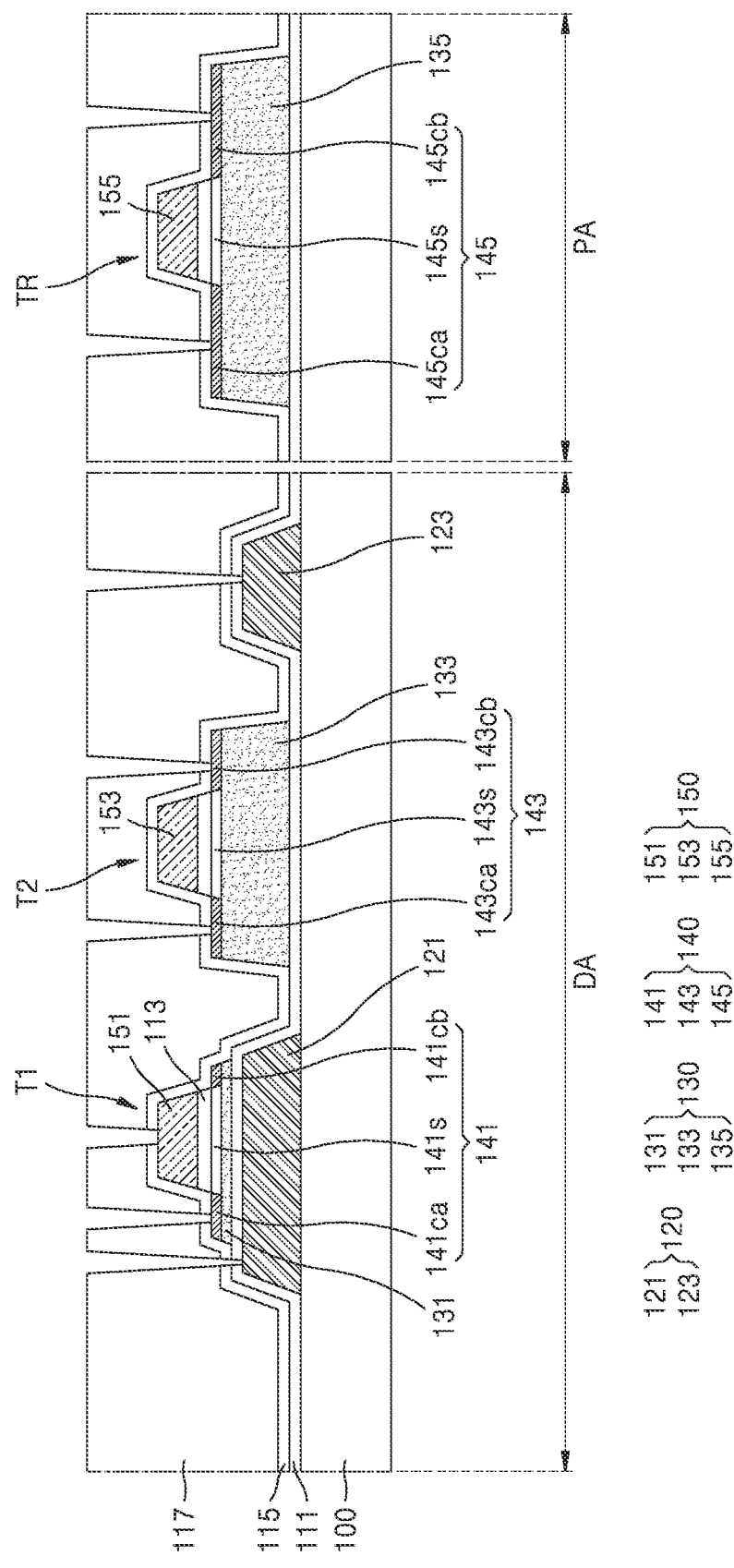

Referring to FIG. 5E, the gate electrode material layer 150p is patterned to form the gate electrode layer 150. The gate electrode layer 150 may include the first gate electrode 151 overlapping the first semiconductor region 141s, the second gate electrode 153 overlapping the second semiconductor region 143s, and the third gate electrode 155 overlapping the third semiconductor region 145s.

The gate insulating layer 113 is formed by patterning the gate insulating material layer 113p by using the gate electrode layer 150 as a self-alignment mask. In other words, the gate insulating layer 113 may be patterned to overlap at least a portion of the semiconductor layer 140.

Plasma treatment is performed during patterning of the gate insulating material layer 113p, and a portion of the semiconductor layer 140 exposed by not being overlapped by the gate electrode layer 150 is subjected to a conductivity increasing process due to the plasma treatment.

Consequently, the exposed conductive regions of the semiconductor layer 140 become conductive during the plasma treatment, and the semiconductor regions overlapped by the gate electrode layer 150 have different properties from those of the conductive regions of the semiconductor layer 140.

After the gate insulating layer 113 and the gate electrode layer 150 are formed, the second insulating layer 115 and the third insulating layer 117 are sequentially formed on the gate electrode layer 150.

After the second insulating layer 115 and the third insulating layer 117 are formed, the plurality of contact holes penetrating through at least one of the buffer layer 111, the second insulating layer 115, and the third insulating layer 117 are formed.

According to an embodiment, the first insulating layer 130 compensating for a depth difference between the contact holes due to the thickness of the first conductive layer 120 may be arranged under the semiconductor layer 140. Accordingly, the respective depths of the plurality of contact holes penetrating through at least one of the buffer layer 111, the second insulating layer 115, and the third insulating layer 117 may be substantially equal to one another. The respective depths of the plurality of contact holes being substantially equal to one another may mean that the surface of the conductive layer or semiconductor layer is not damaged while the contact holes are all being formed by etching. Thus, while an etch process for forming the contact holes is being conducted, the surface of the conductive layer or semiconductor layer may not be damaged.

Referring to FIG. 5F, the second conductive layer 210 is formed on the third insulating layer 117. The second conductive layer 210 may include the pixel electrode 211 of the OLED 200, the first electrode 213, the second electrode 215, the third electrode 217, and the fourth electrode 219.

The second conductive layer 210 may be formed by depositing a second conductive material layer (not shown) on the entire upper surface of the third insulating layer 117 and performing a mask process and an etching process.

After the second conductive layer 210 is formed, the pixel defining layer 119 covering an edge of the pixel electrode 211 and including an opening that exposes a center portion of the pixel electrode 211 is formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 220 is formed within the opening of the pixel defining layer 119. The intermediate layer 220 may include a low-molecular weight or high-molecular weight material. The intermediate layer 220 may be formed by vacuum deposition, screen printing, inkjet printing, laser induced thermal imaging (LITI), or the like.

Next, the opposite electrode 230 is formed to correspond to the plurality of OLEDs 200. The opposite electrode 230 may be formed to cover the display area DA of the substrate 100 through an open mask. The opposite electrode 230 may be formed by using a deposition method such as CVD, PECVD, LPCVD, PVD, sputtering, or ALD.

Figure 6:
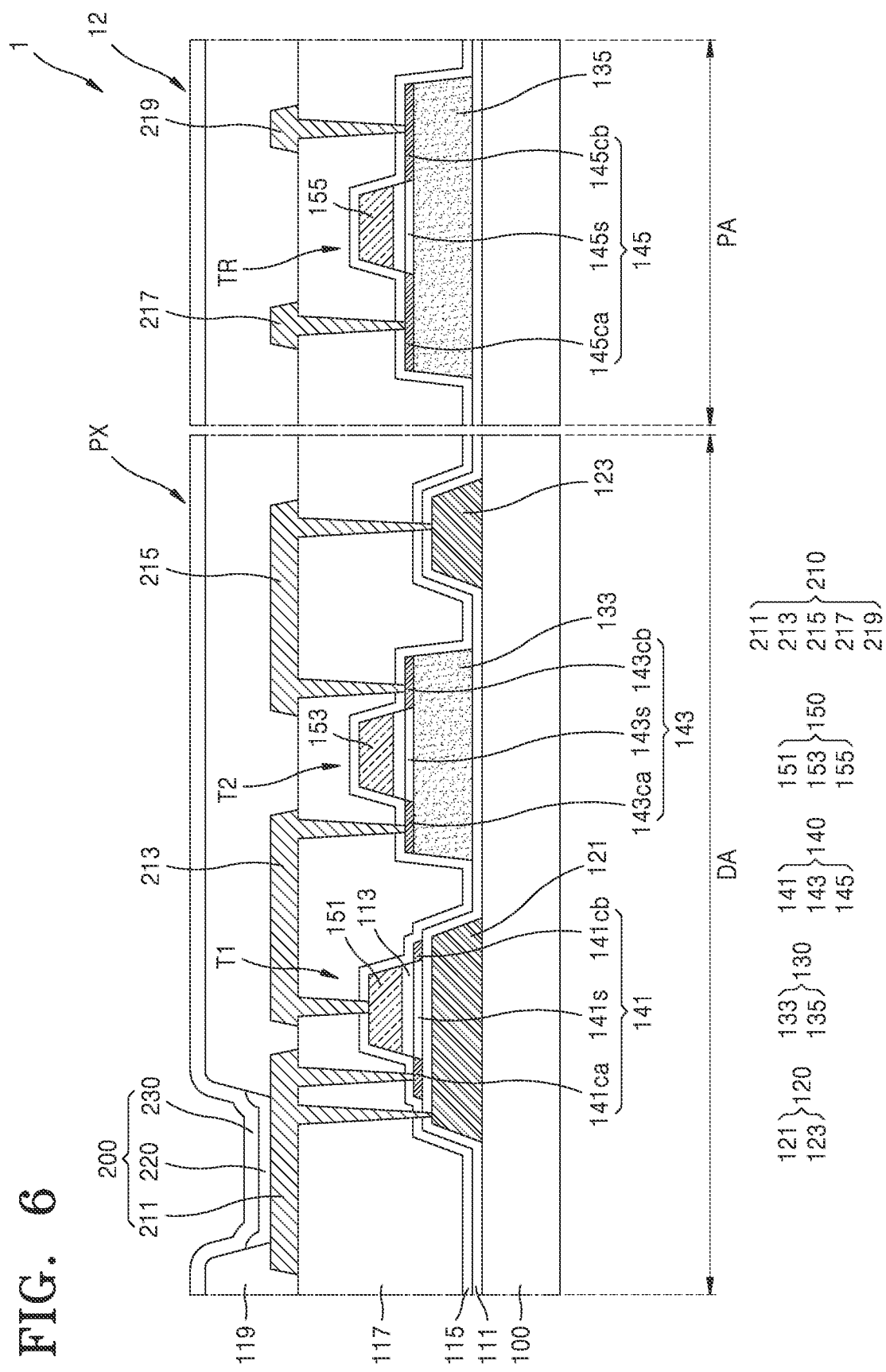
FIG. 6 is a schematic cross-sectional view of a display apparatus according to an embodiment.

FIG. 6 is a schematic cross-sectional view of a display apparatus 1 according to an embodiment. FIG. 6, which is a modification of FIG. 4, is different from FIG. 4 in terms of the structure of a first insulating layer. Overlapping contents will be replaced with the description of FIG. 4, and differences will now be mainly described.

Referring to FIG. 6, in contrast with FIG. 4, no first insulating layers 130 may be between the semiconductor layer 140 and the first conductive layer 120. For example, the first insulating mound 131 of FIG. 4 between the first region 141 of the semiconductor layer 140 and the conductive mound 121 may be omitted.

In other words, the first insulating layer 130 may be arranged below some regions of the semiconductor layer 140 not overlapping the first conductive layer 120. For example, the second insulating mound 133 may be arranged below the second region 143 of the semiconductor layer 140 not overlapping the conductive mound 121. The third insulating mound 135 may be arranged below the third region 145 of the semiconductor layer 140 not overlapping the conductive mound 121.

FIGS. 7A through 7D are cross-sectional views illustrating a method of manufacturing the display apparatus 1 of FIG. 6, according to an embodiment.

Figure 7A:
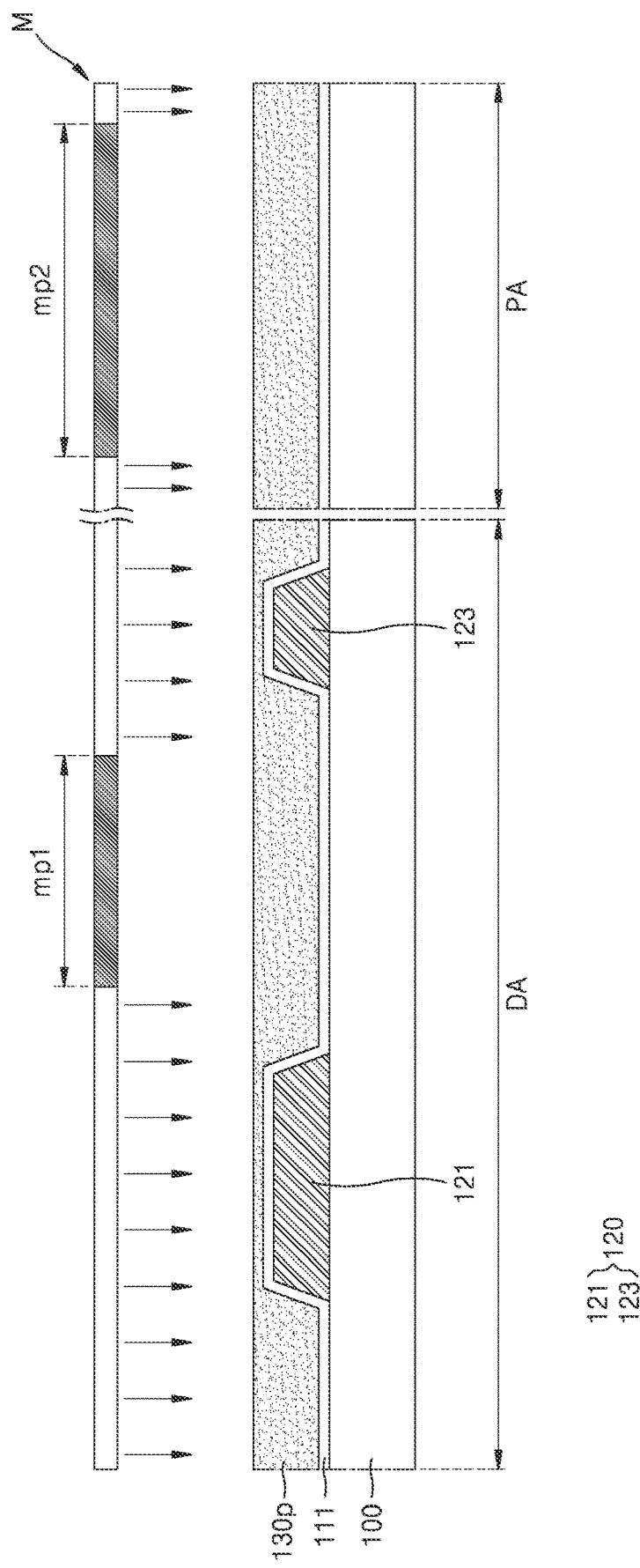

First, referring to FIG. 7A, the insulating material layer 130p is formed on the buffer layer 111.

The insulating material layer 130p may include a positive photoresist, and may be formed by applying a positive photoresist solution onto the buffer layer 111 by using any of various methods such as spin coating, spraying, or dipping. Processes before the insulating material layer 130p is formed on the buffer layer 111 may be the same as FIG. 5A.

A mask M may be arranged on the insulating material layer 130p. The mask M may adjust the amount of light exposure of the insulating material layer 130p in each area. For example, a first portion mp1 and a second portion mp2 of the mask M may be shielded so that the insulating material layer 130p is not exposed to light. The first portion mp1 and the second portion mp2 of the mask M correspond to portions where the second region 143 and the third region 145 of the semiconductor layer 140 are to be disposed, respectively.

Figure 7B:
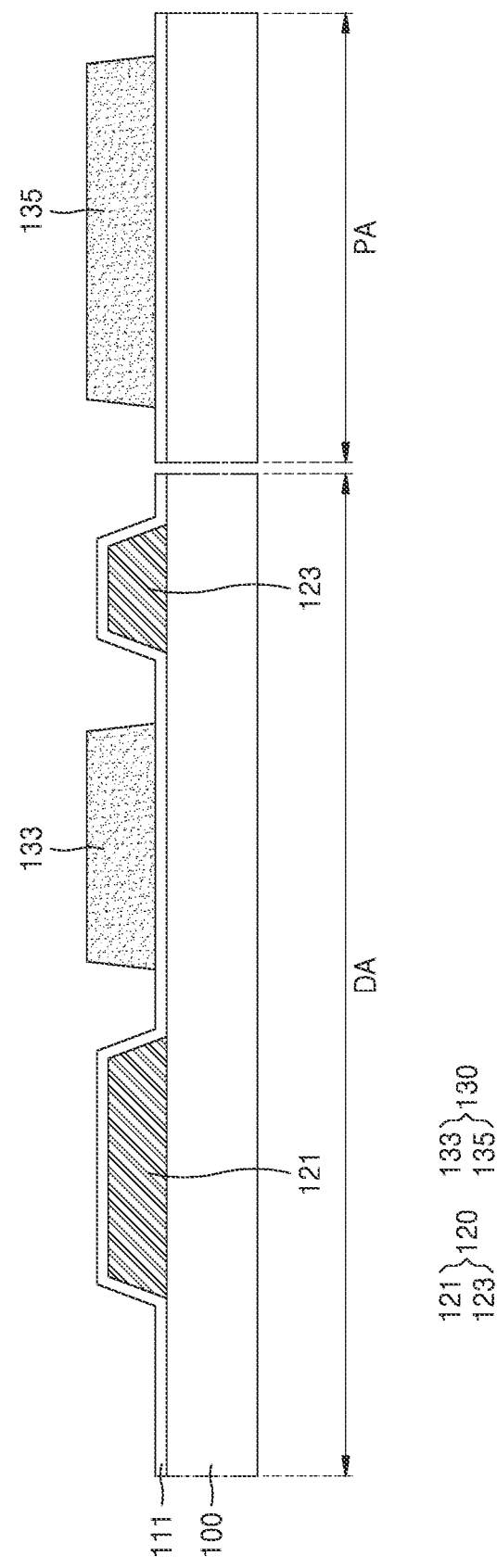

Referring to FIG. 7B, the insulating material layer 130p may be partially exposed to light through the mask M, and a portion of the insulating material layer 130p may be removed by using a developing process. The first insulating layer 130 is formed by removing a portion of the insulating material layer 130p. The first insulating layer 130 may include the second insulating mound 133 corresponding to the first portion mp1 of the mask M, and the third insulating mound 135 corresponding to the second portion mp2 of the mask M.

After the first insulating layer 130 is formed, a degree of adhesion of the third insulating layer 130 to the buffer layer 111 may be increased through a curing and drying process. In this case, the curing and drying process may include a heat treatment process.

Although the insulating material layer 130p includes a positive photoresist in FIGS. 7A and 7B, the insulating material layer 130p may include a negative photoresist. In this case, contrary to when the insulating material layer 130p includes a positive photoresist, a portion of the insulating material layer 130p having no exposure amounts is removed.

Figure 7C:
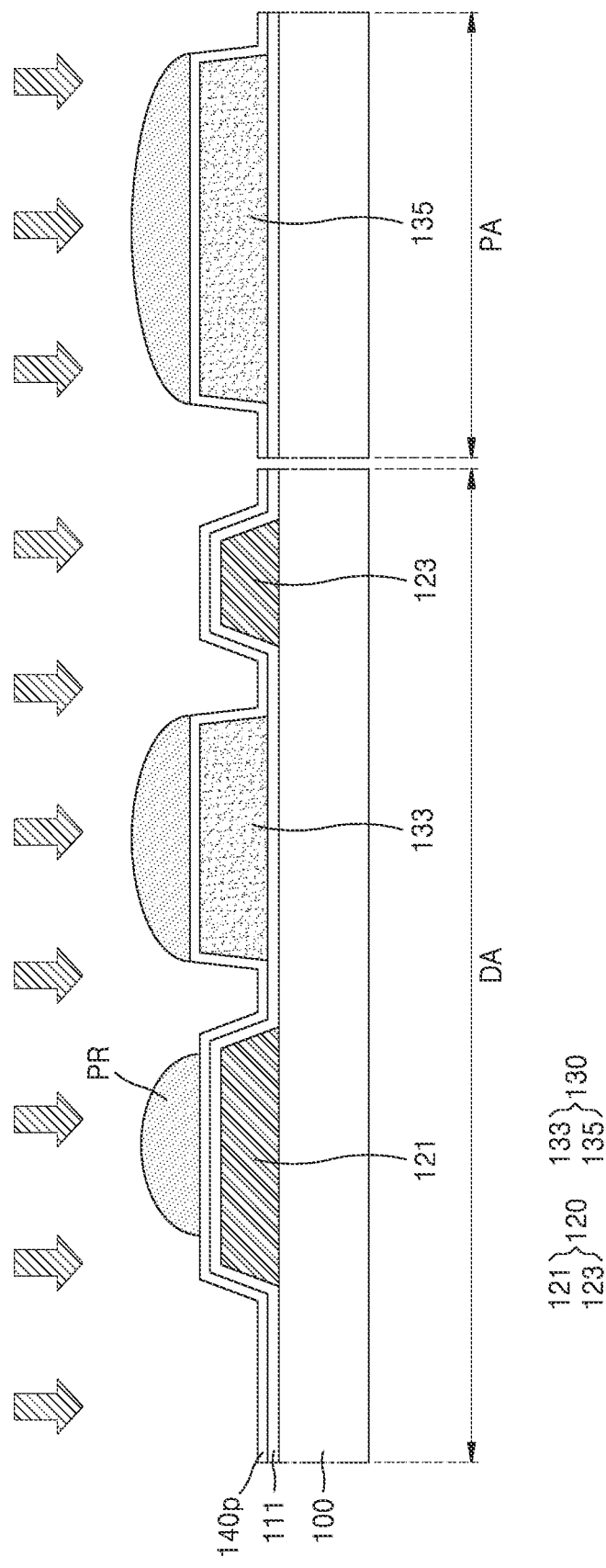

Referring to FIG. 7C, the semiconductor material layer 140p and the photoresist pattern PR are sequentially formed on the buffer layer 111 and the first insulating layer 130.

The semiconductor material layer 140p may include an oxide semiconductor material, amorphous silicon, or polysilicon. The semiconductor material layer 140p may be deposited by CVD or the like.

The photoresist pattern PR may be formed by coating the semiconductor material layer 140p with a positive photoresist solution or a negative photoresist solution by using any of various methods such as spin coating, spraying, or dipping and then partially removing a positive photoresist layer or a negative photoresist layer through a developing process.

Referring to FIG. 7D, a portion of the semiconductor material layer 140p is etched using the photoresist pattern PR formed on the semiconductor material layer 140p to thereby form the semiconductor layer 140. The semiconductor layer 140 may be formed by depositing the semiconductor material layer 140p and performing a mask process and an etching process. For example, the etching process may be a wet etching process.

The semiconductor layer 140 may include the first region 141, the second region 143, and the third region 145 respectively corresponding to photoresist patterns PR. Because the first portion mp1 of the mask M of FIG. 7A corresponds to portion where the second region 143 of the semiconductor layer 140 are to be disposed and the second insulating mound 133 is formed using the mask M, the second insulating mound 133 and the second region 143 of the semiconductor layer 140 correspond to each other. Because the second portion mp2 of the mask M of FIG. 7A corresponds to portion where the third region 145 of the semiconductor layer 140 are to be disposed and the third insulating mound 135 is formed using the mask M, the third insulating mound 135 and the third region 145 of the semiconductor layer 140 correspond to each other.

Processes after the semiconductor layer 140 is formed may be the same as FIGS. 5D through 5F.

Figure 8:
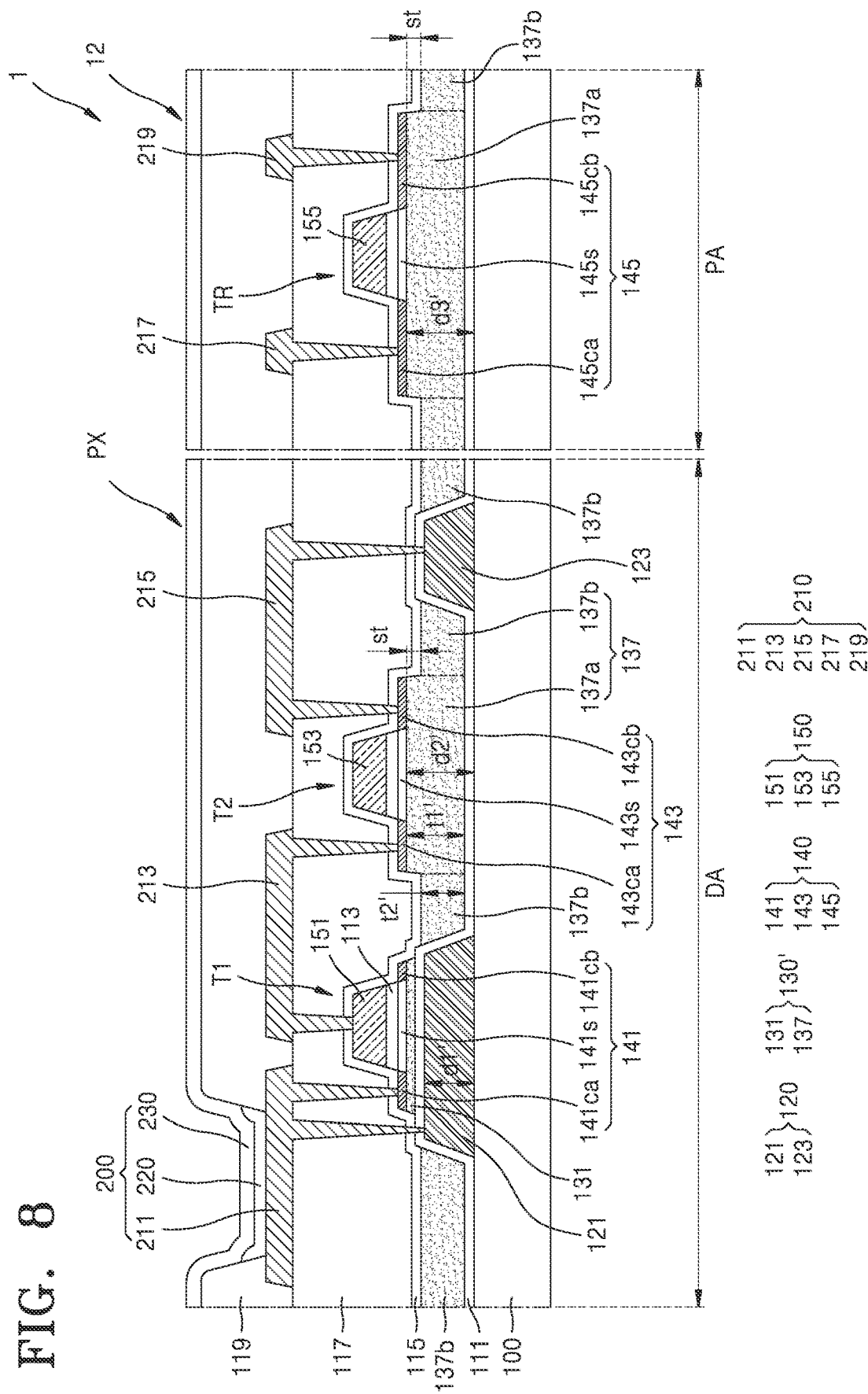
FIG. 8 is a schematic cross-sectional view of a display apparatus according to an embodiment.

FIG. 8 is a schematic cross-sectional view of a display apparatus 1 according to an embodiment; FIG. 8 is a modification of FIG. 4, and is thus different therefrom in the structure of an organic planarization layer 130'. Hereinafter, overlapping contents therebetween will be replaced with the description of FIG. 4, and the differences will be mainly described.

Referring to FIG. 8, the organic planarization layer 130' may be between the buffer layer 111 and the semiconductor layer 140. The organic planarization layer 130' may be a single layer including an organic material or a multi-layer formed by stacking single layers including an organic material. For example, the organic planarization layer 130' may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

The organic planarization layer 130' may include the first insulating mound 131 between the conductive mound 121 and the first region 141 of the semiconductor layer 140. The first region 141 of the semiconductor layer 140 may at least partially overlap the conductive mound 121. The first semiconductor region 141s of the first region 141 of the semiconductor layer 140 may overlap the conductive mound 121.

The organic planarization layer 130' may include the first insulating mound 137 between the conductive mound 121 and the second and third regions 143 and 145 of the semiconductor layer 140. The second and third regions 143 and 145 of the semiconductor layer 140 may not overlap the conductive mound 121. The second semiconductor region 143s of the second region 143 and the third semiconductor region 145s of the third region 145 may not overlap the conductive mound 121.

The fourth insulating layer 137 may include a first portion 137a, and a second portion 137b surrounding at least a portion of the first portion 137a.

The first portion 137a of the fourth insulating layer 137 may have a first thickness t1', and the second portion 137b of the fourth insulating layer 137 may have a second thickness t2'. The first thickness t1' of the first portion 137a of the fourth insulating layer 137 may be different from the second thickness t2' of the second portion 137b of the fourth insulating layer 137. For example, as shown in FIG. 8, the first thickness t1' of the first portion 137a of the fourth insulating layer 137 may be greater than the second thickness t2' of the second portion 137b of the fourth insulating layer 137.

An upper surface of the fourth insulating layer 137 may have a step st between the first portion 137a and the second portion 137b. A vertical distance from the upper surface of the substrate 100 to an upper surface of the first portion 137a may be different from a vertical distance from the upper surface of the substrate 100 to an upper surface of the second portion 137b. For example, as shown in FIG. 8, the vertical distance from the upper surface of the substrate 100 to the upper surface of the first portion 137a may be greater than the vertical distance from the upper surface of the substrate 100 to the upper surface of the second portion 137b.

The second and third regions 143 and 145 of the semiconductor layer 140 may be arranged on the first portion 137a of the fourth insulating layer 137. The first portion 137a of the fourth insulating layer 137 may correspond to the second and third regions 143 and 145 of the semiconductor layer 140.

The organic planarization layer 130' may be formed by adjusting a process time, the number of atoms and ions in a plasma state, energy of atoms and ions in a plasma state, and the like when the dry etching process of FIG. 5B is performed. The organic planarization layer 130' may be formed by etching the insulating material layer 130p to such an extent that the upper surface of a portion of the buffer layer 111 on the first conductive layer 120 is exposed. In this case, the organic planarization layer 130' may be formed using the same photoresist pattern PR as that used to form the semiconductor layer 140.

Because the first portion 137a of the fourth insulating layer 137 is formed using the same photoresist pattern PR as that used to form the second region 143 and the third region 145 of the semiconductor layer 140, a planar shape of the first portion 137a of the fourth insulating layer 137 may substantially correspond to that of the second region 143 and the third region 145 of the semiconductor layer 140.

The organic planarization layer 130' may cover a portion of the first conductive layer 120. For example, as shown in FIG. 8, the fourth insulating layer 137 of the organic planarization layer 130' may at least partially cover a lateral surface of the conductive mound 121 and a lateral surface of the data line 123. The first insulating mound 131 of the organic planarization layer 130' may at least partially cover the upper surface of the conductive mound 121.

According to an embodiment, a vertical distance d2' between the lower surface of the second region 143 of the semiconductor layer 140 and the upper surface of the substrate 100 may be greater than a vertical distance d1' between the upper surface of the conductive mound 121 and the upper surface of the substrate 100. In other words, the vertical distance d2' between the lower surface of the second semiconductor region 143s and the upper surface of the substrate 100 may be greater than the vertical distance d1' between the upper surface of the conductive mound 121 and the upper surface of the substrate 100.

According to an embodiment, a vertical distance d3' between the lower surface of the third region 145 of the semiconductor layer 140 and the upper surface of the substrate 100 may be greater than the vertical distance d1' between the upper surface of the conductive mound 121 and the upper surface of the substrate 100. In other words, a vertical distance d3' between a lower surface of the third semiconductor region 145s and the upper surface of the substrate 100 may be greater than the vertical distance d1' between the upper surface of the conductive mound 121 and the upper surface of the substrate 100.

According to an embodiment, the vertical distance d3' between the lower surface of the third region 145 of the semiconductor layer 140 and the upper surface of the substrate 100 may be substantially equal to the vertical distance d2' between the lower surface of the second region 143 of the semiconductor layer 140 and the upper surface of the substrate 100. In other words, the vertical distance d3' between the lower surface of the third semiconductor region 145s and the upper surface of the substrate 100 may be substantially equal to the vertical distance d2' between the lower surface of the second semiconductor region 143s and the upper surface of the substrate 100.

Figure 9:
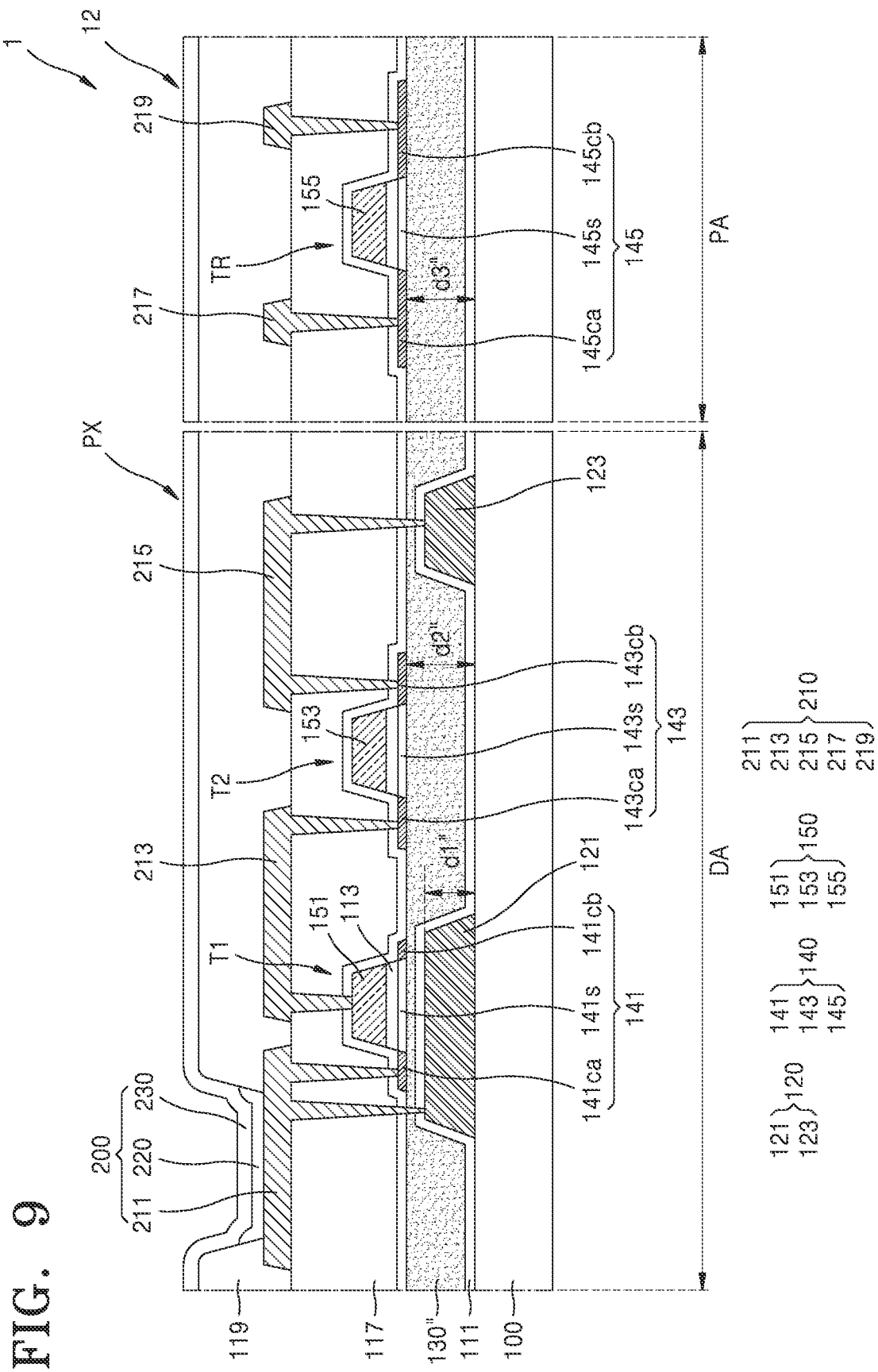
FIG. 9 is a schematic cross-sectional view of a display apparatus according to an embodiment.

FIG. 9 is a schematic cross-sectional view of a display apparatus 1 according to an embodiment. FIG. 9 is a modification of FIG. 8, and is thus different therefrom in the structure of an organic planarization layer 130". Hereinafter, overlapping contents therebetween will be replaced with the description of FIG. 8, and the differences will be mainly described.

Referring to FIG. 9, the organic planarization layer 130" may be between the buffer layer 111 and the semiconductor layer 140. The organic planarization layer 130" may have a single-layer or multi-layer structure of a layer including an organic material, and provides a flat upper surface. The organic planarization layer 130" may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

In FIG. 9, the organic planarization layer 130" covers the entire surfaces of the first conductive layer 120 and the buffer layer 111. However, according to another embodiment, the organic planarization layer 130" may cover respective portions of the first conductive layer 120 and the buffer layer 111. For example, the organic planarization layer 130" may expose the upper surface of the first conductive layer 120 and may cover the lateral surface of the first conductive layer 120.

According to an embodiment, a vertical distance d2" between the lower surface of the second region 143 of the semiconductor layer 140 and the upper surface of the substrate 100 may be greater than a vertical distance d1" between the upper surface of the conductive mound 121 and the upper surface of the substrate 100. In other words, the vertical distance d2" between the lower surface of the second semiconductor region 143s and the upper surface of the substrate 100 may be greater than the vertical distance d1" between the upper surface of the conductive mound 121 and the upper surface of the substrate 100.

According to an embodiment, a vertical distance d3" between the lower surface of the third region 145 of the semiconductor layer 140 and the upper surface of the substrate 100 may be greater than the vertical distance d1" between the upper surface of the conductive mound 121 and the upper surface of the substrate 100. In other words, the vertical distance d3" between a lower surface of the third semiconductor region 145s and the upper surface of the substrate 100 may be greater than the vertical distance d1" between the upper surface of the conductive mound 121 and the upper surface of the substrate 100.

According to an embodiment, the vertical distance d3" between the lower surface of the third region 145 of the semiconductor layer 140 and the upper surface of the substrate 100 may be substantially equal to the vertical distance d2" between the lower surface of the second region 143 of the semiconductor layer 140 and the upper surface of the substrate 100. In other words, the vertical distance d3" between the lower surface of the third semiconductor region 145s and the upper surface of the substrate 100 may be substantially equal to the vertical distance d2" between the lower surface of the second semiconductor region 143s and the upper surface of the substrate 100.

In FIG. 9, the vertical distance d2" between the lower surface of the second region 143 of the semiconductor layer 140 and the upper surface of the substrate 100 is greater than the vertical distance d1" between the upper surface of the conductive mound 121 and the upper surface of the substrate 100. However, according to another embodiment, the vertical distance d2" between the lower surface of the second region 143 of the semiconductor layer 140 and the upper surface of the substrate 100 may be less than the vertical distance d1" between the upper surface of the conductive mound 121 and the upper surface of the substrate 100. According to another embodiment, the vertical distance d1" between the upper surface of the conductive mound 121 and the upper surface of the substrate 100 may be substantially equal to the vertical distance d2" between the lower surface of the second region 143 of the semiconductor layer 140 and the upper surface of the substrate 100. A difference between the vertical distance d1" between the upper surface of the conductive mound 121 and the upper surface of the substrate 100 and the vertical distance d2" between the lower surface of the second region 143 of the semiconductor layer 140 and the upper surface of the substrate 100 may be within a range where a surface of a conductive layer or semiconductor layer is not damaged during an etching process for forming contact holes. In this case, the surface of the conductive layer or the surface of the semiconductor layer may not be damaged during an etch process for forming the contact holes, and excessive etching of at least some of the contact holes may be prevented.

According to embodiments as described above, a display apparatus including contact holes formed to expose at least a portion of a conductive layer or a semiconductor layer without damage to the surface of the conductive layer or the semiconductor layer, and a method of manufacturing the display apparatus may be realized. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
  a substrate;
  a conductive mound arranged on the substrate;
  a first insulating mound arranged on the substrate; and
  a semiconductor layer including a first region arranged on the conductive mound, and a second region arranged on the first insulating mound, wherein the second region of the semiconductor layer substantially covers an upper surface of the first insulating mound, wherein the first insulating mound includes organic material.

2. The display apparatus of claim 1, wherein a vertical distance between a lower surface of the second region of the semiconductor layer and an upper surface of the substrate is greater than a vertical distance between an upper surface of the conductive mound and the upper surface of the substrate.

3. The display apparatus of claim 1, further comprising a second insulating mound between the conductive mound and the first region of the semiconductor layer.

4. The display apparatus of claim 3, wherein a thickness of the first insulating mound is greater than a thickness of the second insulating mound.

5. The display apparatus of claim 3, wherein the first region of the semiconductor layer substantially covers an upper surface of the second insulating mound.

6. The display apparatus of claim 1, further comprising:
a display element;
a driving transistor configured to control a magnitude of a driving current flowing to the display element, the driving transistor including the first region of the semiconductor layer;
a scan transistor configured to transmit a data voltage to the driving transistor in response to a scan signal, the scan transistor including the second region of the semiconductor layer; and
a storage capacitor having a first electrode and a second electrode, the second electrode being connected to a gate of the driving transistor.

7. The display apparatus of claim 6, wherein the driving transistor further includes a first gate electrode arranged on the first region of the semiconductor layer and at least partially overlapping the first region of the semiconductor layer, and
the scan transistor further includes a second gate electrode arranged on the second region of the semiconductor layer and at least partially overlapping the second region of the semiconductor layer.

8. The display apparatus of claim 6, further comprising:
a third insulating mound arranged on the substrate; and
a gate driver configured to provide the scan signal, the gate driver including a transistor,
wherein the semiconductor layer further includes a third region arranged on the third insulating mound, and
the transistor includes the third region of the semiconductor layer and a third gate electrode at least partially overlapping the third region of the semiconductor layer.

9. The display apparatus of claim 8, wherein a vertical distance between a lower surface of the third region of the semiconductor layer and an upper surface of the substrate is greater than a vertical distance between an upper surface of the conductive mound and the upper surface of the substrate.

10. The display apparatus of claim 8, wherein a vertical distance between a lower surface of the third region of the semiconductor layer and an upper surface of the substrate is substantially equal to a vertical distance between a lower surface of the second region of the semiconductor layer and the upper surface of the substrate.

11. The display apparatus of claim 8, wherein the third insulating mound and the third region of the semiconductor layer correspond to each other.

12. A display apparatus comprising:
a substrate;
a conductive mound arranged on the substrate;
an organic planarization layer arranged on the substrate and at least partially covering the conductive mound; and
a semiconductor layer arranged on the organic planarization layer and including a first semiconductor region overlapping the conductive mound and a second semiconductor region not overlapping the conductive mound.

13. The display apparatus of claim 12, wherein a vertical distance between a lower surface of the second semiconductor region and an upper surface of the substrate is greater than a vertical distance between an upper surface of the conductive mound and the upper surface of the substrate.

14. The display apparatus of claim 12, further comprising:
a display element;
a driving transistor configured to control a magnitude of a driving current flowing to the display element, the driving transistor including the first semiconductor region;
a scan transistor configured to transmit a data voltage to the driving transistor in response to a scan signal, the scan transistor including the second semiconductor region; and
a storage capacitor having a first electrode and a second electrode, the second electrode connects to a gate of the driving transistor.

15. The display apparatus of claim 14, wherein the driving transistor further includes a first gate electrode arranged on the first semiconductor region and at least partially overlapping the first semiconductor region, and
the scan transistor further includes a second gate electrode arranged on the second semiconductor region and at least partially overlapping the second semiconductor region.

16. The display apparatus of claim 14, further comprising a gate driver configured to provide the scan signal, the gate driver including a transistor,
wherein a display area and a peripheral area are defined in the substrate,
the driving transistor and the scan transistor are arranged in the display area,
the gate driver is arranged in the peripheral area,
the semiconductor layer further includes a third semiconductor region arranged in the peripheral area, and
the transistor includes the third semiconductor region and a third gate electrode at least partially overlapping the third semiconductor region.

17. The display apparatus of claim 16, wherein a vertical distance between a lower surface of the third semiconductor region and an upper surface of the substrate is greater than a vertical distance between an upper surface of the conductive mound and the upper surface of the substrate and substantially equal to a vertical distance between a lower surface of the second semiconductor region and the upper surface of the substrate.

18. The display apparatus of claim 14, further comprising a conductive layer arranged on the substrate and including the conductive mound and a data line for transmitting the data voltage.

19. The display apparatus of claim 12, wherein the organic planarization layer covers a lateral surface of the conductive mound.

20. The display apparatus of claim 12, wherein the organic planarization layer includes a first portion having a first thickness, and a second portion having a second thickness, the second thickness being less than the first thickness.

21. The display apparatus of claim 20, wherein the second semiconductor region is arranged in the first portion of the organic planarization layer.

\* \* \* \* \*